(12) United States Patent
Mochizuki

(10) Patent No.: US 8,955,987 B2
(45) Date of Patent: Feb. 17, 2015

(54) LIGHT EMITTING DEVICE, SUPER-LUMINESCENT DIODE, AND PROJECTOR

(71) Applicant: Seiko Epson Corporation, Tokyo (JP)

(72) Inventor: Masamitsu Mochizuki, Fujimi (JP)

(73) Assignee: Seiko Epson Corporation (JP)

( * ) Notice: Subject to any disclaimer, the term of this patent is extended or adjusted under 35 U.S.C. 154(b) by 98 days.

(21) Appl. No.: 13/886,696

(22) Filed: May 3, 2013

(65) Prior Publication Data

US 2013/0301012 A1 Nov. 14, 2013

(30) Foreign Application Priority Data

May 9, 2012 (JP) ................................ 2012-107959

(51) Int. Cl.
*H01L 33/00* (2010.01)
*H01L 33/02* (2010.01)
(Continued)

(52) U.S. Cl.
CPC ............ *H01L 33/38* (2013.01); *G03B 21/2033* (2013.01); *H01L 33/02* (2013.01);
(Continued)

(58) Field of Classification Search
CPC .... G03B 21/16; G03B 21/20; G03B 21/2013; G03B 21/2033; H04N 9/31; H04N 9/3161; H04N 9/3164; H01L 33/00; H01L 33/0045; H01L 33/02; H01L 33/10; H01L 33/20; H01L 33/36; H01L 33/38; H01L 27/153; F21Y 2101/02; F21Y 2101/025; F21K 9/00

USPC ........................... 353/30–31, 33, 85, 94, 122; 362/230–231, 249.02, 551, 553, 555; 257/94, 98; 385/14–15, 33–34, 39, 385/50–51, 130–131, 146; 372/39, 43.01, 372/45.01, 46.01, 46.012, 50.12, 64, 92, 93, 372/97

See application file for complete search history.

(56) References Cited

U.S. PATENT DOCUMENTS 6,546,035 B2 * 4/2003 Imafuji et al. ............. 372/50.12
6,930,024 B2 * 8/2005 Onishi ......................... 438/463

(Continued)

FOREIGN PATENT DOCUMENTS

| JP | 2002-299750 A | 10/2002 |
| JP | 2010-072012 A | 4/2010 |
| JP | 2011-077327 A | 4/2011 |

*Primary Examiner* — Tony Ko
*Assistant Examiner* — Jori S Reilly-Diakun
(74) *Attorney, Agent, or Firm* — Harness, Dickey & Pierce, P.L.C.

(57) ABSTRACT

A light emitting device includes a substrate, a laminated body formed by stacking a first cladding layer, a first active layer, a second cladding layer, a third cladding layer, a second active layer, and a fourth cladding layer on the substrate in this order, a first electrode connected to the first cladding layer, a second electrode connected to the second cladding layer and the third cladding layer, and a third electrode connected to the fourth cladding layer, the first active layer generates first light using the first electrode and the second electrode, the second active layer generates second light using the second electrode and the third electrode, and a side surface of the first active layer is provided with an emitting section for emitting the first light, and a side surface of the second active layer is provided with an emitting section for emitting the second light.

18 Claims, 17 Drawing Sheets

(51) Int. Cl.
*H01L 33/20* (2010.01)
*H01L 33/36* (2010.01)
*H01L 33/38* (2010.01)
*G03B 21/20* (2006.01)
*H01L 27/15* (2006.01)
*H01L 33/10* (2010.01)
*G03B 21/16* (2006.01)
*G03B 33/12* (2006.01)
*G03B 35/20* (2006.01)

(52) U.S. Cl.
CPC ............... *H01L 33/36* (2013.01); *H01L 33/20* (2013.01); *H01L 27/153* (2013.01); *H01L 33/0045* (2013.01); *H01L 33/10* (2013.01); *G03B 21/16* (2013.01); *G03B 33/12* (2013.01); *G03B 35/20* (2013.01)

USPC ............... 353/94; 362/230; 362/231; 257/94; 257/98; 372/39; 372/43.01; 372/46.01; 372/92

(56) References Cited

U.S. PATENT DOCUMENTS

| | | | | |
|---|---|---|---|---|
| 6,956,881 | B2* | 10/2005 | Behringer et al. | 372/43.01 |
| 7,369,583 | B2* | 5/2008 | Ledentsov et al. | 372/20 |
| 8,537,872 | B2* | 9/2013 | Mochizuki | 372/93 |
| 8,637,337 | B2* | 1/2014 | Katsuyama | 438/47 |
| 2010/0046566 | A1* | 2/2010 | Kudo | 372/45.01 |
| 2010/0187966 | A1* | 7/2010 | Mochizuki | 313/114 |
| 2011/0026108 | A1* | 2/2011 | Takahashi et al. | 359/344 |
| 2012/0229773 | A1* | 9/2012 | Mochizuki | 353/30 |
| 2012/0229774 | A1* | 9/2012 | Mochizuki | 353/30 |
| 2012/0235196 | A1* | 9/2012 | Mochizuki | 257/98 |
| 2013/0050656 | A1* | 2/2013 | Mochizuki | 353/38 |

* cited by examiner

LIGHT EMITTING DEVICE, SUPER-LUMINESCENT DIODE, AND PROJECTOR

BACKGROUND

1. Technical Field

The present invention relates to a light emitting device, a super-luminescent diode, and a projector.

2. Related Art

A super-luminescent diode (hereinafter also referred to as an "SLD") is a semiconductor light emitting element, which is capable of providing an output up to several hundreds of mW with a single element similarly to a semiconductor laser while having a broad spectrum and thus being incoherent similarly to an ordinary light emitting diode.

The SLD is used as, for example, a light source of a projector. For example, there has been proposed a system of a projector disposing each of the SLD for emitting red light, green light, and blue light immediately below a light valve, and simultaneously performing control of the emission angle of the light (collection, collimation, and so on) and uniform illumination using microlenses. It is desirable in such a projector to form two or more colors of light sources (out of the three colors) on the same substrate in order to achieve common use of the optical system for miniaturization and cost reduction of the projector.

For example, JP-A-2002-299750 discloses a technology of forming two semiconductor lasers with respective wavelengths on the same substrate.

By using the technology described above, it is possible to form the semiconductor lasers or the SLDs respectively having two colors of blue and green on the same substrate.

However, in the light emitting device described in the patent document mentioned above, an n-side electrode and a p-side electrode for injecting current into an active layer are formed on the both sides of the light emitting device across the active layer and the substrate. Therefore, there is a problem that the layout of the wiring lines to be electrically connected to the electrodes is made complicated and a higher mounting cost is required when mounting the light emitting device.

SUMMARY

An advantage of some aspects of the invention is to provide a light emitting device which makes the layout of the wiring lines to be electrically connected to the electrodes easy and simple when mounting. Another advantage of some aspects of the invention is to provide a super-luminescent diode which makes the layout of the wiring lines to be electrically connected to the electrodes easy and simple when mounting. Still another advantage of some aspects of the invention is to provide a projector including the light emitting device described above or the super-luminescent diode described above.

A light emitting device according to an aspect of the invention includes a substrate, a laminated body formed by stacking a first cladding layer, a first active layer, a second cladding layer, a third cladding layer, a second active layer, and a fourth cladding layer on the substrate in this order, at least one first electrode electrically connected to the first cladding layer, a second electrode electrically connected to the second cladding layer and the third cladding layer, and a third electrode electrically connected to the fourth cladding layer, the first electrode, the second electrode, and the third electrode are located on an opposite surface of the laminated body to the substrate, the first active layer generates first light in response to current injected using the first electrode and the second electrode, the second active layer generates second light in response to current injected using the second electrode and the third electrode, and at least one side surface of the first active layer included in a side surface of the laminated body having a normal line perpendicular to a stacking direction of the laminated body is provided with an emitting section from which the first light is emitted, and at least one side surface of the second active layer included in the side surface of the laminated body is provided with an emitting section from which the second light is emitted.

According to such a light emitting device as described above, it is possible to simplify the layout of the wiring lines electrically connected to the electrodes when mounting.

The light emitting device according to the aspect of the invention may be configured such that the first active layer has a first gain region adapted to generate the first light in response to the injection of the current, the first gain region includes a first gain portion having a belt-like shape extending from a first emitting section provided to a first side surface of the first active layer to a first reflecting section provided to a second side surface of the first active layer, a second gain portion having a belt-like shape extending from the first reflecting section to a second reflecting section provided to a third side surface of the first active layer, and a third gain portion having a belt-like shape extending from the second reflecting section to a second emitting section provided to the first side surface, the second active layer has a second gain region adapted to generate the second light in response to the injection of the current, the second gain region includes a fourth gain portion having a belt-like shape extending from a third emitting section provided to a fourth side surface of the second active layer to a third reflecting section provided to a fifth side surface of the second active layer, a fifth gain portion having a belt-like shape extending from the third reflecting section to a fourth reflecting section provided to a sixth side surface of the second active layer, and a sixth gain portion having a belt-like shape extending from the fourth reflecting section to a fourth emitting section provided to the fourth side surface, the first side surface and the fourth side surface constitute a part of the side surface of the laminated body having the normal line perpendicular to the stacking direction of the laminated body, and the first light emitted from the first emitting section, the first light emitted from the second emitting section, the second light emitted from the third emitting section, and the second light emitted from the fourth emitting section are emitted in the same direction.

According to such a light emitting device as described above, the distance between the first emitting section and the second emitting section can be adjusted by the length of the second gain portion. Further, the distance between the third emitting section and the fourth emitting section can be adjusted by the length of the fourth gain portion.

The light emitting device according to the aspect of the invention may be configured such that the first gain region and the second gain region each have a bracket shape when viewed from the stacking direction of the laminated body.

According to such a light emitting device as described above, the distance between the first emitting section and the second emitting section of the first gain region can be adjusted. Further, the distance between the third emitting section and the fourth emitting section of the second gain region can be adjusted.

The light emitting device according to the aspect of the invention may be configured such that a wavelength of the first light is no smaller than 435 nm and no larger than 485 nm, and a wavelength of the second light is no smaller than 485 nm and no larger than 570 nm.

According to such a light emitting device as described above, it is possible to set the first light to blue light, and the second light to green light. Thus, it is possible to use the light emitting device as the blue light source and the green light source of the projector. Therefore, the number of the light emitting devices can be reduced compared to the case of using respective light emitting devices for three light sources. Therefore, the number of optical systems such as lens arrays (microlens arrays) to which the light emitted from the light source is input can be reduced. As a result, the cost reduction can more surely be achieved.

The light emitting device according to the aspect of the invention may be configured such that the first gain region and the second gain region fail to overlap each other when viewed from the stacking direction of the laminated body.

According to such a light emitting device as described above, the light loss in the overlapping portion can be reduced. For example, when the first gain region and the second gain region overlap each other in the plan view, the light loss in the overlapping portion may be increased in some cases.

The light emitting device according to the aspect of the invention may be configured such that the second gain portion of the first gain region includes a gap section where the second gain portion is divided, and the fourth gain portion of the second gain region is disposed so as to pass through the gap section when viewed from the stacking direction of the laminated body.

According to such a light emitting device as described above, it is possible to simplify the layout of the wiring lines electrically connected to the electrodes when mounting.

The light emitting device according to the aspect of the invention may be configured such that the first gain region is surrounded by the second gain region and the first side surface when viewed from the stacking direction of the laminated body.

According to such a light emitting device as described above, the length of the second gain region can be set to be greater than the length of the first gain region. For example, in the case in which the first light generated in the first gain region is the blue light, and the second light generated in the second gain region is the green light, the length of the gain region of the green light with low gain can be increased to thereby improve the intensity and the emission efficiency of the green light. In the case of using such a light emitting device to the projector, since the intensity and the emission efficiency of the green light having a high luminous sensitivity can be improved, a projector with higher luminous flux can be realized.

The light emitting device according to the aspect of the invention may be configured such that the second electrode has a surface larger than the first gain region to cover the first gain region when viewed from the stacking direction of the laminated body, the third electrode has a surface larger than the second gain region to cover the second gain region when viewed from the stacking direction of the laminated body, the first gain region is located below an end portion of the second electrode, the end portion being located near to the second gain region, and the second gain region is located below an end portion of the third electrode, the end portion being located near to the first gain region.

According to such a light emitting device as described above, it is possible to more surely decrease the distance between the first emitting section and the third emitting section, and the distance between the second emitting section and the fourth emitting section. Thus, it is possible to make the lights emitted from the first emitting section and the third emitting section enter a single collecting lens, and make the lights emitted from the second emitting section and the fourth emitting section enter another single collecting lens more reliably. Therefore, in the case of using the light emitting device as the light source of the projector, the number of microlenses can be decreased.

A projector according to another aspect of the invention includes the light emitting device according to any one of the above aspects of the invention, a light modulation device adapted to modulate the lights emitted from the light emitting device in accordance with image information to form an image, and a projection device adapted to project the image formed by the light modulation device.

According to such a projector as described above, the number of optical systems and the number of light valves can be decreased. Thus, the cost reduction can be achieved.

A super-luminescent diode according to still another aspect of the invention includes a substrate, a laminated body formed by stacking a first cladding layer, a first active layer, a second cladding layer, a third cladding layer, a second active layer, and a fourth cladding layer on the substrate in this order, at least one first electrode electrically connected to the first cladding layer, a second electrode electrically connected to the second cladding layer and the third cladding layer, and a third electrode electrically connected to the fourth cladding layer, the first electrode, the second electrode, and the third electrode are located on an opposite surface of the laminated body to the substrate, the first active layer generates first light in response to current injected using the first electrode and the second electrode, and the second active layer generates second light in response to current injected using the second electrode and the third electrode.

According to such a super-luminescent diode as described above, it is possible to simplify the layout of the wiring lines electrically connected to the electrodes when mounting.

A projector according to yet another aspect of the invention includes the super-luminescent diode according to the aspect of the invention, a light modulation device adapted to modulate the lights emitted from the super-luminescent diode in accordance with image information to form an image, and a projection device adapted to project the image formed by the light modulation device.

According to such a projector as described above, the number of optical systems and the number of light valves can be decreased. Thus, the cost reduction can be achieved.

BRIEF DESCRIPTION OF THE DRAWINGS

The invention will be described with reference to the accompanying drawings, wherein like numbers reference like elements.

DESCRIPTION OF AN EXEMPLARY EMBODIMENT

Hereinafter, a preferred embodiment of the invention will be explained in detail with reference to the accompanying drawings. It should be noted that the embodiment described below does not unreasonably limit the contents of the invention as set forth in the appended claims. Further, all of the constituents explained hereinafter are not necessarily essential elements of the invention.

1. Light Emitting Device

Figure 1:
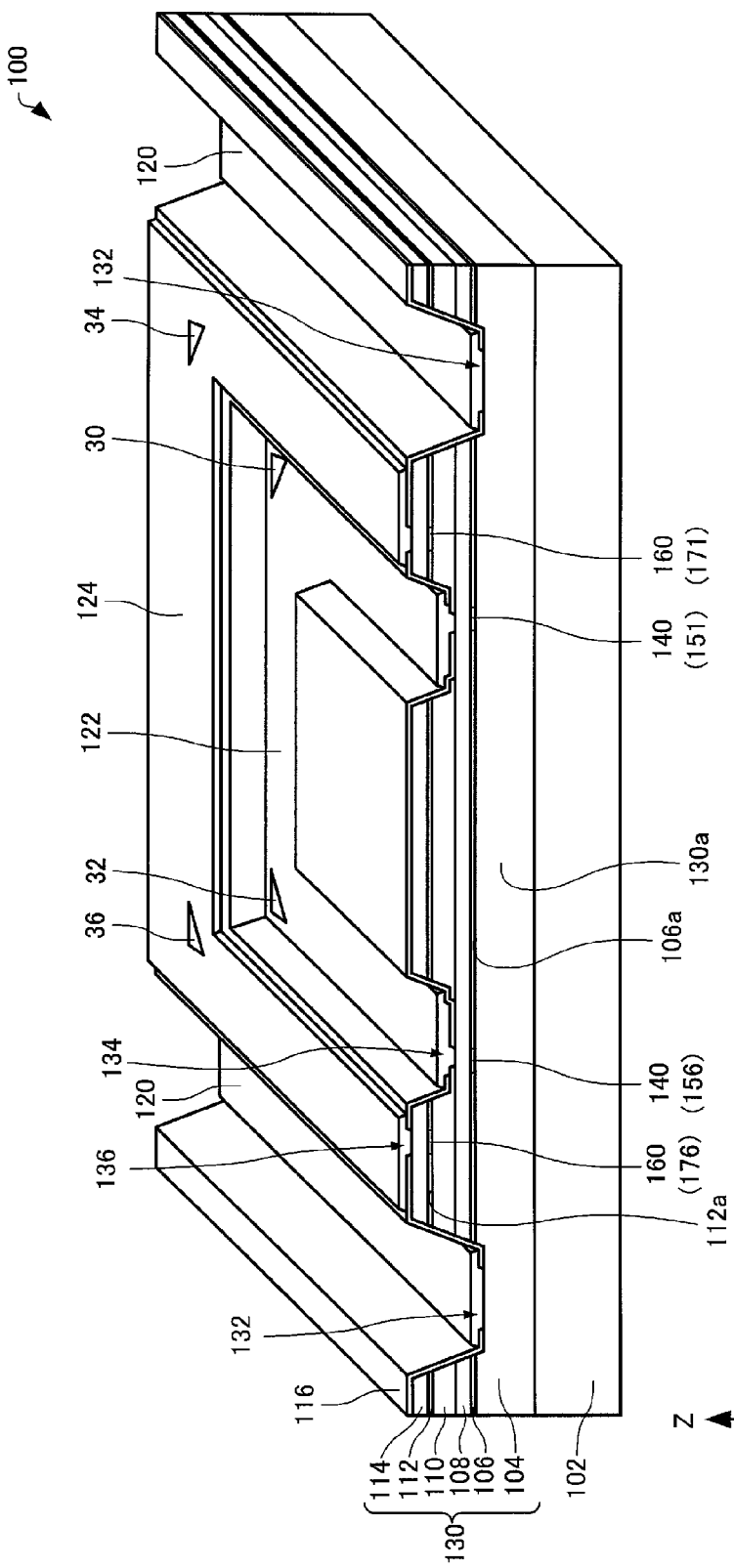
FIG. 1 is a perspective view schematically showing a light emitting device according to an embodiment of the invention.
Figure 2:
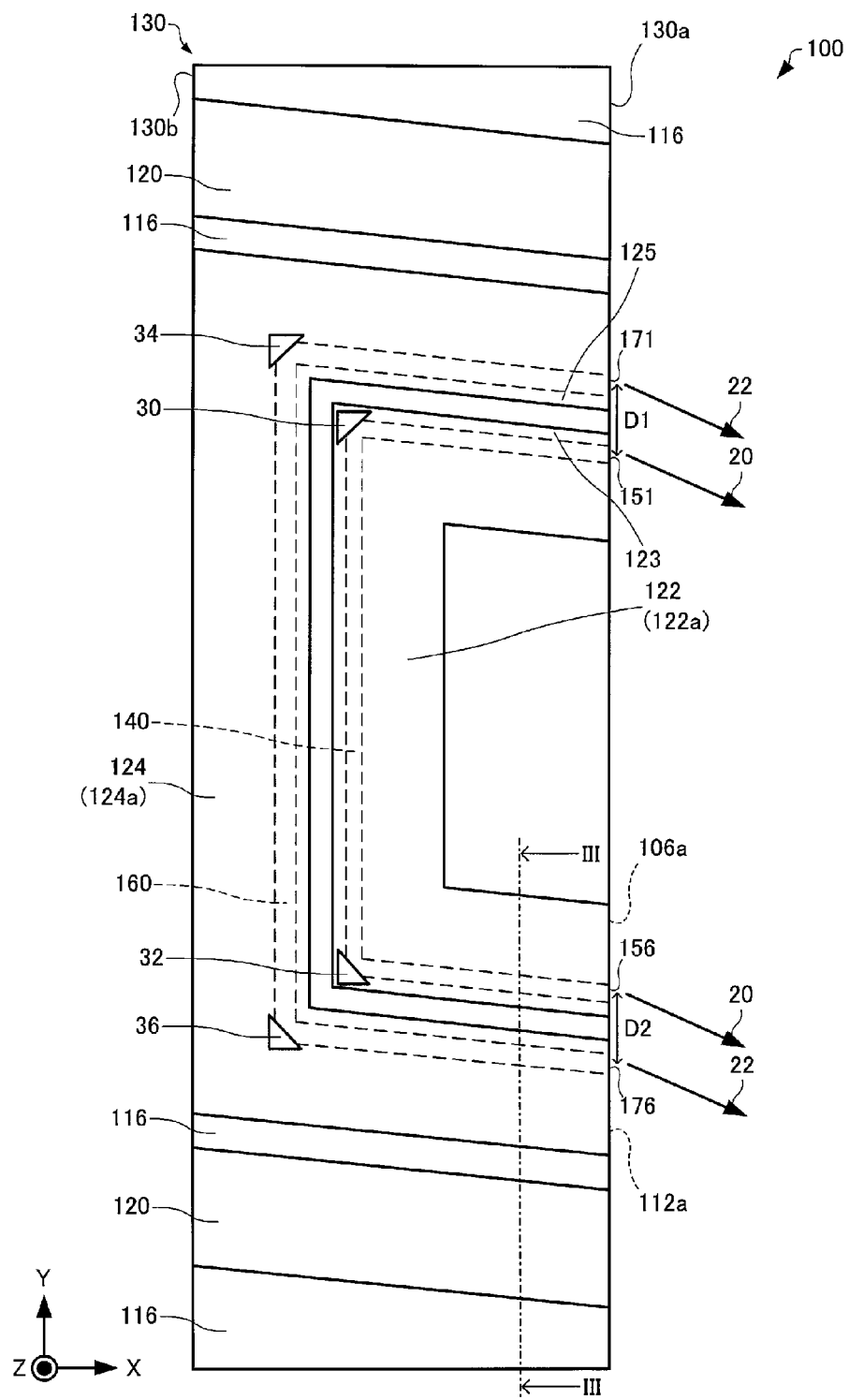
FIG. 2 is a plan view schematically showing the light emitting device according to the embodiment.
Figure 3:
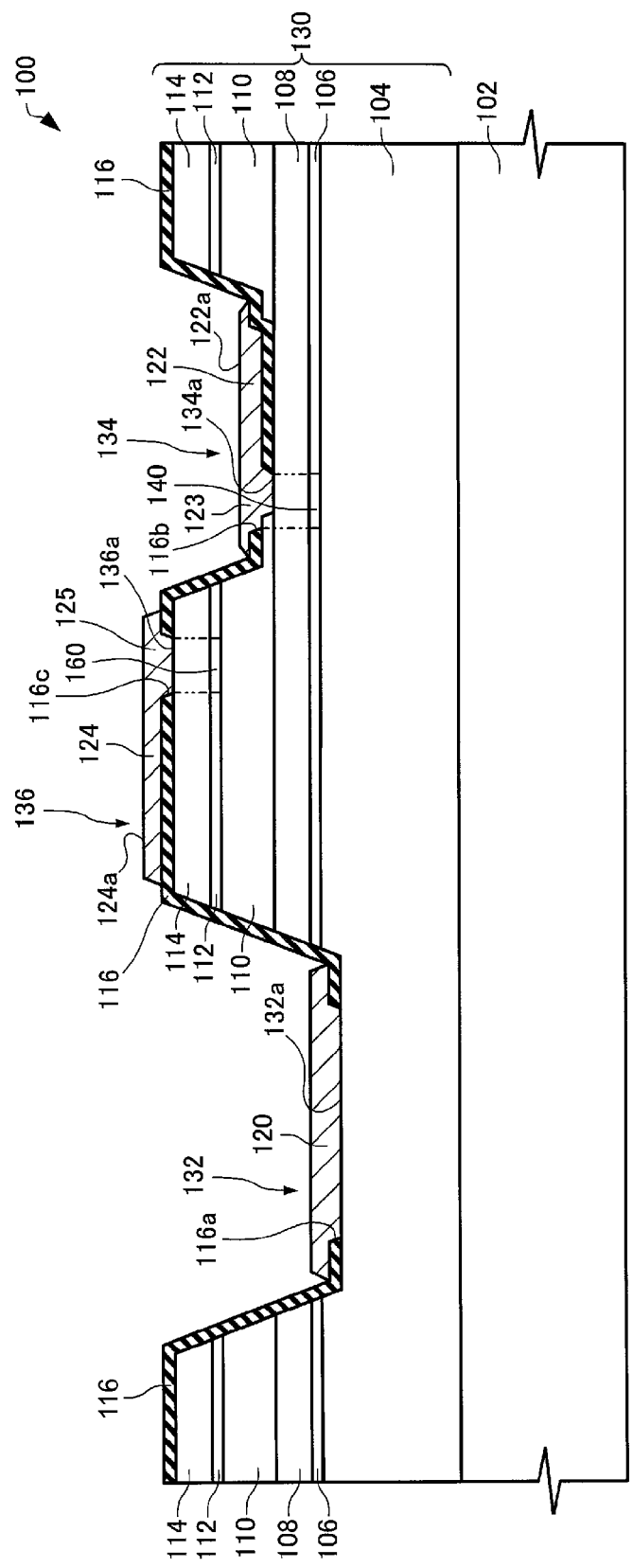
FIG. 3 is a cross-sectional view schematically showing the light emitting device according to the embodiment.
Figure 4:
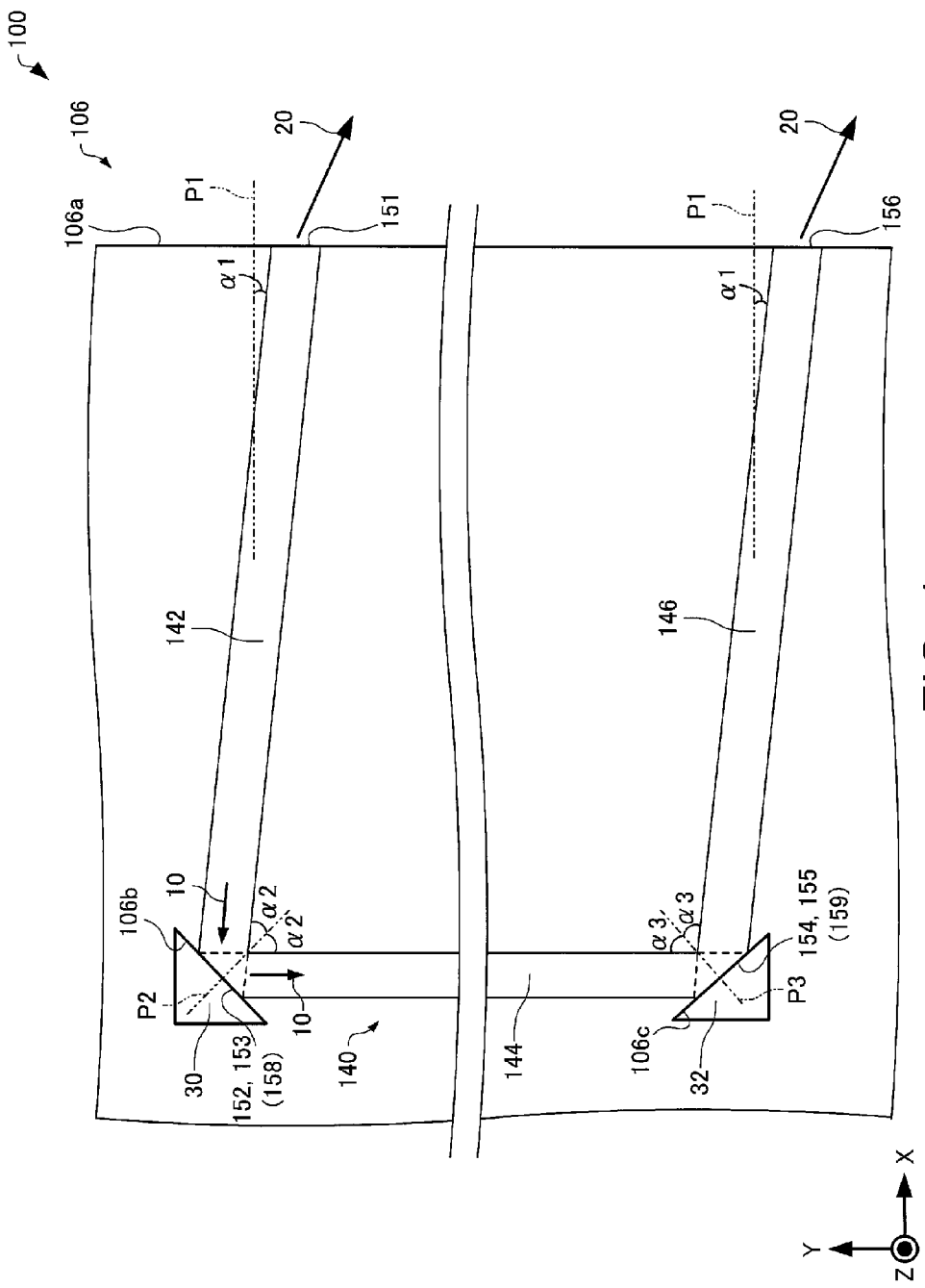
FIG. 4 is a plan view schematically showing the light emitting device according to the embodiment.
Figure 5:
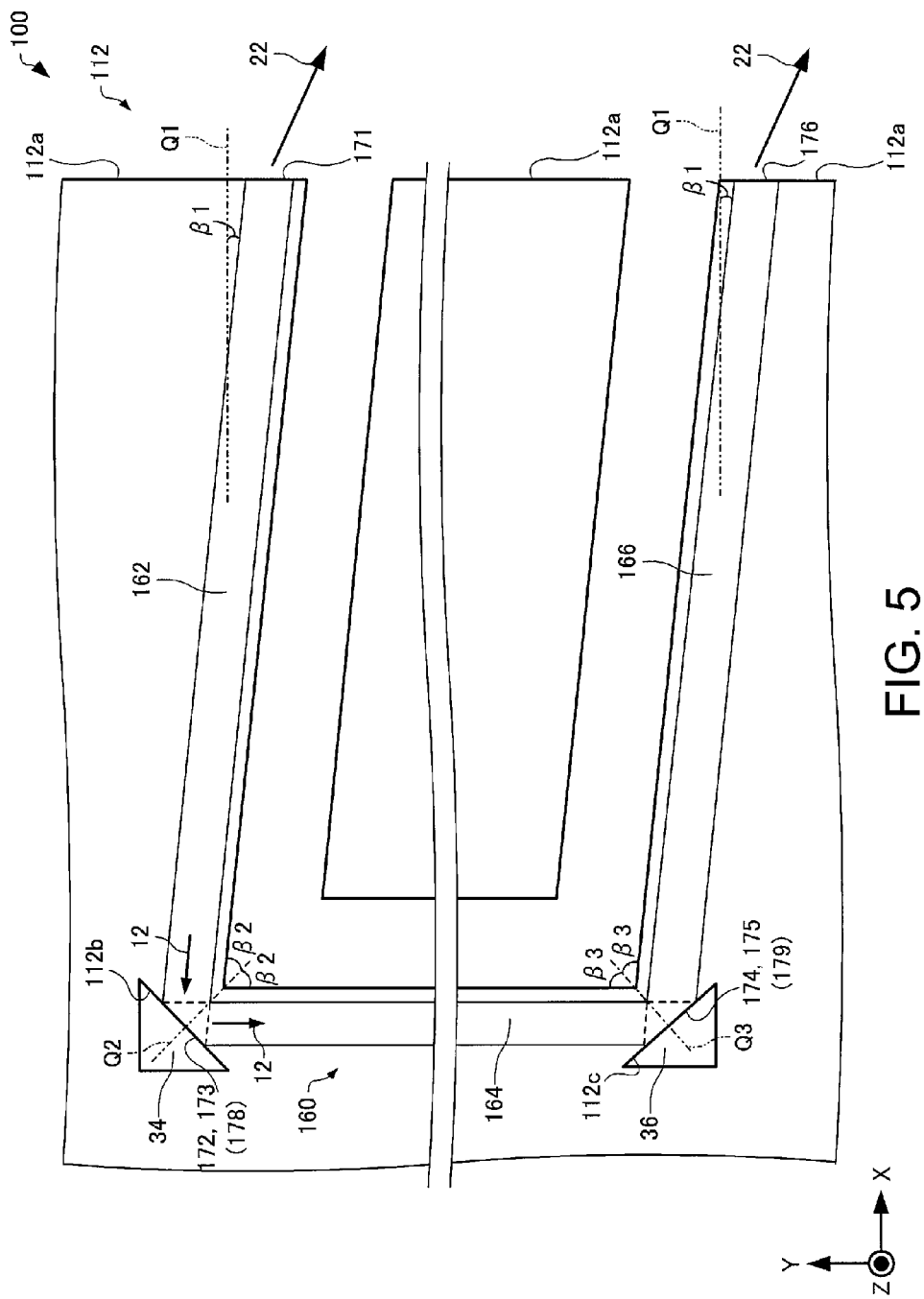
FIG. 5 is a plan view schematically showing the light emitting device according to the embodiment.

Firstly, a light emitting device according to the present embodiment will be explained with reference to the accompanying drawings. FIG. 1 is a perspective view schematically showing a light emitting device 100 according to the present embodiment. FIG. 2 is a plan view schematically showing the light emitting device 100 according to the present embodiment. FIG. 3 is a cross-sectional view along the line III-III shown in FIG. 2, and schematically shows the light emitting device 100 according to the present embodiment. FIG. 4 is a plan view schematically showing the light emitting device 100 according to the present embodiment. FIG. 5 is a plan view schematically showing the light emitting device 100 according to the present embodiment. It should be noted that in FIG. 4, the cross-section including a first active layer 106 of the light emitting device 100 is shown as a plan view, and in FIG. 5, the cross-section including a second active layer 112 of the light emitting device 100 is shown as a plan view. Further, in FIGS. 1 through 5, an X axis, a Y axis, and a Z axis are shown as three axes perpendicular to each other.

The case in which the light emitting device 100 is an SLD will be explained below. Unlike the semiconductor laser, in the SLD, the laser oscillation can be prevented by suppressing formation of the resonator due to edge reflection (the end surface reflection). Therefore, the speckle noise can be reduced.

As shown in FIGS. 1 to 5, the light emitting device 100 includes a substrate 102, a laminated body 130, first electrodes 120, a second electrode 122, and a third electrode 124. Further, the light emitting device 100 can include an insulating layer 116.

As the substrate 102, for example, an insulating substrate, a semiconductor substrate, or an electrically conductive substrate is used. More specifically, a sapphire substrate having an insulating property can be used as the substrate 102.

The laminated body 130 is formed on the substrate 102. The laminated body 130 can have a structure obtained by stacking a first cladding layer 104, a first active layer 106, a second cladding layer 108, a third cladding layer 110, a second active layer 112, and a fourth cladding layer 114 on the substrate 102 in this order. The first cladding layer 104, the first active layer 106, the second cladding layer 108, the third cladding layer 110, the second active layer 112, and the fourth cladding layer 114 are stacked in the Z-axis direction.

The laminated body 130 can have first portions 132, a second portion 134, and a third portion 136. The first portions 132 are located between the substrate 102 and the respective first electrodes 120, and are provided with the first cladding layer 104. The second portion 134 is located between the substrate 102 and the second electrode 122, and is provided with the first cladding layer 104, the first active layer 106, the second cladding layer 108, and the third cladding layer 110. The third portion 136 is located between the substrate 102 and the third electrode 124, and is provided with the first cladding layer 104, the first active layer 106, the second cladding layer 108, the third cladding layer 110, the second active layer 112, and the fourth cladding layer 114.

In the example shown in FIG. 2, the planar shape (the shape viewed from the Z-axis direction) of the laminated body 130 is a rectangular shape. The laminated body 130 can have side surfaces 130a, 130b parallel to the stacking direction (the Z-axis direction) (having a normal line perpendicular to the stacking direction) of the laminated body.

The second portion 134 of the laminated body 130 is provided with opening sections 30, 32. In the example shown in FIGS. 1 and 2, the opening sections 30, 32 are also provided to the second electrode 122. The opening sections 30, 32 extend, for example, from the second electrode 122 to the first cladding layer 104.

The third portion 136 of the laminated body 130 is provided with opening sections 34, 36. In the example shown in FIGS. 1 and 2, the opening sections 34, 36 are also provided to the third electrode 124. The opening sections 34, 36 extend, for example, from the third electrode 124 to the third cladding layer 110.

The inside of the opening sections 30, 32, 34, and 36 can be hollowed, or filled with a reflecting film (the detail will be described later). The planar shape of the opening sections 30, 32, 34, and 36 is not particularly limited, but is a triangular shape in the example shown in FIG. 2.

The first cladding layer 104 is formed on the substrate 102. As the first cladding layer 104, a GaN layer or an AlGaN layer of a first conductivity type (e.g., an n type), for example, is used.

The first active layer 106 is formed on the first cladding layer 104. The first active layer 106 has a multiple quantum well (MQW) structure having, for example, three quantum well structures each composed of a well layer and a barrier layer. As the well layer, for example, an InGaN layer is used. As the barrier layer, for example, a GaN layer, an InGaN layer having the proportion of the In component lower than that in the well layer, or an AlGaN layer having the proportion of the Al component lower than that in the first cladding layer 104 is used.

As shown in FIG. 4, the first active layer 106 has a first side surface 106a, a second side surface 106b, and a third side surface 106c. The first side surface 106a constitutes a part of the side surface 130a of the laminated body 130. In the example shown in FIG. 4, the first side surface 106a is a surface of the first active layer 106, the surface being located on the +X-axis direction side. The second side surface 106b defines one of the opening section 30. The third side surface 106c defines one of the opening section 32. The second side surface 106b and the third side surface 106c are tilted with respect to the first side surface 106a. The first side surface 106a can be a cleaved surface formed by cleavage. The second side surface 106b and the third side surface 106c each can be an etched surface formed by etching.

Part of the first active layer 106 constitutes a first gain region 140. The first gain region 140 can generate first light in response to injection current, and the first light can be guided in the first gain region 140 while receiving a gain. The first gain region 140 is provided with a first gain portion 142, a second gain portion 144, and a third gain portion 146.

The first gain portion 142 extends from the first side surface 106a to the second side surface 106b in a plan view. When viewed from the stacking direction of the laminated body 130 (hereinafter also expressed as "in the plan view"), the first gain portion 142 has a predetermined width, and is provided with a belt-like and linear longitudinal shape along the extending direction of the first gain region 142. The first gain portion 142 has a first end surface 151 provided to the connection portion with the first side surface 106a, and a second end surface 152 provided to the connection portion with the second side surface 106b.

It should be noted that the extending direction of the first gain portion 142 denotes, for example, the extending direction of a straight line passing through the center of the first end surface 151 and the center of the second end surface 152 in the plane view. Further, it can also be the extending direction of a boundary line of the first gain portion 142 (with the portion except the first gain portion 142).

Similarly, also in other gain portions, the extending direction denotes, for example, the extending direction of a straight line passing through the centers of two end surfaces in the plan view. Further, the direction of the boundary line of the gain portion (with the portion except the gain portion) can also be adopted.

The first gain portion 142 is connected to the first side surface 106a while being tilted at an angle α1 with a perpendicular P1 of the first side surface 106a in the plan view. In other words, it can be said that the extending direction of the first gain portion 142 has an angle α1 with the perpendicular P1. The angle α1 is an acute angle, and is smaller than the critical angle.

The first gain portion 142 is connected to the second side surface 106b while being tilted at an angle α2 with a perpendicular P2 of the second side surface 106b in the plan view. In other words, it can be said that the extending direction of the first gain portion 142 has an angle α2 with the perpendicular P2.

The second gain portion 144 extends from the second side surface 106b to the third side surface 106c in the plan view. In the plan view, the second gain portion 144 has a predetermined width, and is provided with a belt-like and linear longitudinal shape along the extending direction of the second gain portion 144. The second gain portion 144 has a third end surface 153 provided to the connection portion with the second side surface 106b, and a fourth end surface 154 provided to the connection portion with the third side surface 106c. In the plan view, the extending direction of the second gain portion 144 is parallel to, for example, the first side surface 106a.

It should be noted that the sentence that "the extending direction of the second gain portion 144 is parallel to the first side surface 106a" denotes that the tilt angle of the second gain portion 144 with respect to the first side surface 106a is within ±1° in the plan view taking the production tolerance into consideration.

The third end surface 153 of the second gain portion 144 overlaps the second end surface 152 of the first gain portion 142 on the second side surface 106b. In the example shown in the drawings, the second end surface 152 and the third end surface 153 completely overlap each other in an overlapping plane 158.

The second gain portion 144 is connected to the second side surface 106b while being tilted at the angle α2 with the perpendicular P2 of the second side surface 106b in the plan view. In other words, it can be said that the extending direction of the second gain portion 144 has an angle α2 with the perpendicular P2. That is, the angle of the first gain portion 142 with respect to the perpendicular P2 and the angle of the second gain portion 144 with respect to the perpendicular P2 are equal to each other within the range of the production tolerance. The angle α2 is, for example, an acute angle, and is equal to or larger than the critical angle. Thus, the second side surface 106b can totally reflect the light generated in the first gain region 140.

It should be noted that the sentence that "an angle θ1 and an angle θ2 are equal to each other within the production tolerance" denotes that the difference between the angles is within, for example, ±2° taking the production tolerance such as etching into consideration.

The second gain portion 144 is connected to the third side surface 106c while being tilted at an angle α3 with a perpendicular P3 of the third side surface 106c in the plan view. In other words, it can be said that the extending direction of the second gain portion 144 has an angle α3 with the perpendicular P3.

The length of the second gain portion 144 in the extending direction can be larger than the length of the first gain portion 142 in the extending direction and the length of the third gain portion 146 in the extending direction. The length of the second gain portion 144 in the extending direction can also be equal to or greater than the sum of the length of the first gain portion 142 in the extending direction and the length of the third gain portion 146 in the extending direction. It should be noted that "the length of the second gain portion 144 in the extending direction" can also be said to be the distance between the center of the third end surface 153 and the center of the fourth end surface 154. Similarly, also in other gain portions, it can be said that the length in the extending direction is the distance between the centers of the two end surfaces.

The third gain portion 146 extends from the third side surface 106c to the first side surface 106a in the plan view. In the plan view, the third gain portion 146 has, for example, a predetermined width, and is provided with a belt-like and linear longitudinal shape along the extending direction of the third gain portion 146. The third gain portion 146 has a fifth end surface 155 provided to the connection portion with the third side surface 106c, and a sixth end surface 156 provided to the connection portion with the first side surface 106a.

The fifth end surface 155 of the third gain portion 146 overlaps the fourth end surface 154 of the second gain portion 144 on the third side surface 106c. In the example shown in the drawings, the fourth end surface 154 and the fifth end surface 155 completely overlap each other in an overlapping plane 159.

The third gain portion 146 is connected to the third side surface 106c while being tilted at an angle α3 with the perpendicular P3 of the third side surface 106c in the plan view. In other words, it can be said that the extending direction of the third gain portion 146 has an angle α3 with the perpendicular P3. That is, the angle of the second gain portion 144 with respect to the perpendicular P3 and the angle of the third gain portion 146 with respect to the perpendicular P3 are equal to each other within the range of the production tolerance. The angle α3 is, for example, an acute angle, and is equal to or larger than the critical angle. Thus, the third side surface 106c can totally reflect the light generated in the first gain region 140.

The third gain portion 146 is connected to the first side surface 106a while being tilted at an angle α1 with the perpendicular P1 in the plan view. In other words, it can be said that the longitudinal direction of the third gain portion 146 has an angle α1 with the perpendicular P1. That is, the first gain portion 142 and the third gain portion 146 are connected to the first side surface 106a in the same direction, and are parallel to each other. More specifically, the extending direction of the first gain portion 142 and the extending direction of the third gain portion 146 are parallel to each other. Thus, the first light 20 emitted from the first end surface 151 and the first light 20 emitted from the sixth end surface 156 can be emitted in the same direction.

As described above, by setting the angles α2, α3 to be equal to or larger than the critical angle, and setting the angle α1 to be smaller than the critical angle, the reflectance of the first side surface 106a can be made lower than the reflectance of the second side surface 106b and the reflectance of the third side surface 106c. Thus, it is possible for the first end surface 151 provided to the first side surface 106a to become a first emitting section (a first emitting section 151) for emitting the light generated in the first gain region 140. It is possible for the sixth end surface 156 provided to the first side surface 106a to become a second emitting section (a second emitting section 156) for emitting the light generated in the first gain region 140. It is possible for the overlapping plane 158 between the end surfaces 152, 153 provided to the second side surface 106b to become a first reflecting section (a first reflecting section 158) for reflecting the light generated in the first gain region 140. It is possible for the overlapping plane 159 between the end surfaces 154, 155 provided to the third side surface 106c to become a second reflecting section (a second reflecting section 159) for reflecting the light generated in the first gain region 140.

In other words, the first gain portion 142 extends from the first emitting section 151 to the first reflecting section 158, the second gain portion 144 extends from the first reflecting section 158 to the second reflecting section 159, the third gain portion 146 extends from the second reflecting section 159 to the second emitting section 156. Therefore, it can be said that the first gain region 140 has a bracket shape (a U shape with corners) in the plan view.

It should be noted that, although the surfaces of the emitting sections 151, 156 and the reflecting sections 158, 159 are exposed in the example shown in the drawing, it is also possible for the first side surface 106a (the emitting sections 151, 156) to be covered by an antireflection film, and for the second side surface 106b and the third side surface 106c (the reflecting sections 158, 159) to be covered by a reflecting film. Thus, even under the condition of the incident angle, the refractive index, and so on with which the light generated in the first gain region 140 fails to be totally reflected by the reflecting sections 158, 159, it is possible to make the reflectance of the first side surface 106a lower than the reflectance of the second side surface 106b and the reflectance of the third side surface 106c in the wavelength band of the light generated in the first gain region 140. Further, by covering the first side surface 106a with the antireflection film, it can be possible to suppress the light generated in the first gain region 140 to be multiply reflected directly between the first end surface 151 and the sixth end surface 156. As a result, since it can be prevented to constitute the direct resonator, the laser oscillation of the light generated in the first gain region 140 can be suppressed.

As the reflecting film and the antireflection film, for example, an $SiO_2$ layer, a $Ta_2O_5$ layer, an $Al_2O_3$ layer, a TiN layer, a $TiO_2$ layer, an SiON layer, an SiN layer, and a multi-layer film of these layers can be used. Further, it is also possible to form a distributed Bragg reflector (DBR) on each of the side surfaces 106b, 106c by etching to thereby obtain a high reflectance.

Further, the angle α1 can be an angle larger than 0°. Thus, it is possible to prevent the light generated in the first gain region 140 from being multiply reflected directly between the first end surface 151 and the sixth end surface 156. As a result, since it can be prevented to constitute the direct resonator, the laser oscillation of the light generated in the first gain region 140 can be suppressed or prevented.

It should be noted that the angle α1 can be equal to 0° although not shown in the drawings. In other words, the extending direction of the gain portions 142, 146 can be parallel to the perpendicular P1 in the plan view. As described above, even in such a configuration, by covering the first side surface 106a with the antireflection film, it is possible to suppress the light generated in the first gain region 140 to be multiply reflected directly between the first end surface 151 and the sixth end surface 156.

As shown in FIGS. 1 and 3, the second cladding layer 108 is formed on the first active layer 106. As the second cladding layer 108, a GaN layer or an AlGaN layer of a second conductivity type (e.g., a p type), for example, is used.

A pin diode is constituted by, for example, the p-type second cladding layer 108, the first active layer 106 with no impurity doped, and the n-type first cladding layer 104. Each of the first cladding layer 104 and the second cladding layer 108 is a layer having a forbidden-band width larger than that of the first active layer 106 and a refractive index smaller than that of the first active layer 106. The first active layer 106 has a function of generating the first light in response to the injection current by the first electrodes 120 and the second electrode 122 and a function of guiding the first light while amplifying the first light. The first cladding layer 104 and the second cladding layer 108 sandwiching the first active layer 106 therebetween have a function of confining the injected carriers (electrons and holes) and the light therein (suppressing the leakage of carriers and light).

In the light emitting device 100, when applying a forward bias voltage of the pin diode between the first electrodes 120 and the second electrode 122 (injecting electrical current), the first gain region 140 is generated in the first active layer 106, and there occurs recombination of electrons and holes in the first gain region 140. The recombination generates light. The stimulated emission occurs in a chained manner taking the light thus generated as a starting point, and the light intensity is amplified inside the first gain region 140 to which electrical current is injected.

For example, as shown in FIG. 4, the first light 10 generated in the first gain portion 142 and proceeding toward the second side surface 106b is amplified in the first gain portion 142, and is then reflected by the first reflecting section 158, and then proceeds through the second gain portion 144 toward the third side surface 106c. Then, the first light 10 is further reflected by the second reflecting section 159, then proceeds through the third gain portion 146, and is then emitted from the sixth end surface 156 as the first light 20. On this occasion, the light intensity is also amplified in the gain portions 144, 146. Similarly, the first light generated in the third gain portion 146 and proceeding toward the third side surface 106c is amplified in the third gain portion 146, and is then reflected by the second reflecting section 159, and then proceeds through the second gain portion 144 toward the second side surface 106b. Then, the first light is further reflected by the first reflecting section 158, then proceeds through the first gain portion 142, and is then emitted from the first end surface 151 as the first light 20. On this occasion, the light intensity is also amplified in the gain portions 142, 144.

It should be noted that some of the light generated in the first gain portion 142 is emitted directly from the first end surface 151 as the first light 20. Similarly, some of the light generated in the third gain portion 146 is emitted directly from the sixth end surface 156 as the first light 20. These lights are also amplified in the respective gain portions 142, 146 in a similar manner.

As shown in FIGS. 1 and 3, the third cladding layer 110 is formed on the second cladding layer 108. As the third cladding layer 110, a GaN layer or an AlGaN layer of the second conductivity type (e.g., the p type), for example, is used.

The second active layer 112 is formed on the third cladding layer 110. The second active layer 112 has a multiple quantum well (MQW) structure having, for example, three quantum well structures each composed of a well layer and a barrier layer. As the well layer, for example, an InGaN layer is used. As the barrier layer, for example, a GaN layer, an InGaN layer having the proportion of the In component lower than that in the well layer, or an AlGaN layer having the proportion of the Al component lower than that in the first cladding layer 104 is used. It should be noted that it is possible that the In component of the InGaN layer constituting the well layer of the first active layer 106 and the In component of the InGaN layer constituting the well layer of the second active layer 112 are different from each other to thereby make the wavelength of the first light generated in the first active layer 106 and the wavelength of the second light generated in the second active layer 112 different from each other.

As shown in FIG. 5, the second active layer 112 has a fourth side surface 112a, a fifth side surface 112b, and a sixth side surface 112c. The fourth side surface 112a constitutes a part of the side surface 130a of the laminated body 130. In the example shown in FIG. 5, the fourth side surface 112a is a surface of the second active layer 112, the surface being located on the +X-axis direction side. The fifth side surface 112b defines one of the surfaces of the opening section 34. The sixth side surface 112c defines one of the surfaces of the opening section 36. The fifth side surface 112b and the sixth side surface 112c are tilted with respect to the fourth side surface 112a. The fourth side surface 112a can be a cleaved surface formed by cleavage. The fifth side surface 112b and the sixth side surface 112c each can be an etched surface formed by etching.

Part of the second active layer 112 constitutes a second gain region 160. The second gain region 160 can generate second light in response to injection current, and the second light can be guided in the second gain region 160 while receiving a gain. The second gain region 160 is provided with a fourth gain portion 162, a fifth gain portion 164, and a sixth gain portion 166.

The fourth gain portion 162 extends from the fourth side surface 112a to the fifth side surface 112b in the plan view. In the plan view, the fourth gain portion 162 has a predetermined width, and is provided with a belt-like and linear longitudinal shape along the extending direction of the fourth gain portion 162. The fourth gain portion 162 has a first end surface 171 provided to the connection portion with the fourth side surface 112a, and a second end surface 172 provided to the connection portion with the fifth side surface 112b.

The fourth gain portion 162 is connected to the fourth side surface 112a while being tilted at an angle β1 with a perpendicular Q1 of the fourth side surface 112a in the plan view. In other words, it can be said that the extending direction of the fourth gain portion 162 has an angle β1 with the perpendicular Q1. The angle β1 is an acute angle, and is smaller than the critical angle.

The fourth gain portion 162 is connected to the fifth side surface 112b while being tilted at an angle β2 with a perpendicular Q2 of the fifth side surface 112b in the plan view. In other words, it can be said that the extending direction of the fourth gain portion 162 has an angle β2 with the perpendicular Q2.

The fifth gain portion 164 extends from the fifth side surface 112b to the sixth side surface 112c in the plan view. In the plan view, the fifth gain portion 164 has a predetermined width, and is provided with a belt-like and linear longitudinal shape along the extending direction of the fifth gain portion 164. The fifth gain portion 164 has a third end surface 173 provided to the connection portion with the fifth side surface 112b, and a fourth end surface 174 provided to the connection portion with the sixth side surface 112c. In the plan view, the extending direction of the fifth gain portion 164 is parallel to, for example, the fourth side surface 112a.

It should be noted that the sentence that "the extending direction of the fifth gain portion 164 is parallel to the fourth side surface 112a" denotes that the tilt angle of the fifth gain portion 164 with respect to the fourth side surface 112a is within ±1° in the plan view taking the production tolerance into consideration.

The third end surface 173 of the fifth gain portion 164 overlaps the second end surface 172 of the fourth gain portion 162 on the fifth side surface 112b. In the example shown in the drawings, the second end surface 172 and the third end surface 173 completely overlap each other in an overlapping plane 178.

The fifth gain portion 164 is connected to the fifth side surface 112b while being tilted at an angle β2 with the perpendicular Q2 of the fifth side surface 112b in the plan view. In other words, it can be said that the extending direction of the fifth gain portion 164 has an angle β2 with the perpendicular Q2. That is, the angle of the fourth gain portion 162 with respect to the perpendicular Q2 and the angle of the fifth gain portion 164 with respect to the perpendicular Q2 are equal to each other within the range of the production tolerance. The angle β2 is, for example, an acute angle, and is equal to or larger than the critical angle. Thus, the fifth side surface 112b can totally reflect the light generated in the second gain region 160.

The fifth gain portion 164 is connected to the sixth side surface 112c while being tilted at an angle β3 with a perpendicular Q3 of the sixth side surface 112c in the plan view. In other words, it can be said that the extending direction of the fifth gain portion 164 has an angle β3 with the perpendicular Q3.

The length of the fifth gain portion 164 in the extending direction can be larger than the length of the fourth gain portion 162 in the extending direction, and the length of the sixth gain portion 166 in the extending direction. The length of the fifth gain portion 164 in the extending direction can also be equal to or greater than the sum of the length of the fourth gain portion 162 in the extending direction and the length of the sixth gain portion 166 in the extending direction.

The sixth gain portion 166 extends from the sixth side surface 112c to the fourth side surface 112a in the plan view. In the plan view, the sixth gain portion 166 has, for example, a predetermined width, and is provided with a belt-like and linear longitudinal shape along the extending direction of the sixth gain portion 166. The sixth gain portion 166 has a fifth end surface 175 provided to the connection portion with the sixth side surface 112c, and a sixth end surface 176 provided to the connection portion with the fourth side surface 112a.

The fifth end surface 175 of the sixth gain portion 166 overlaps the fourth end surface 174 of the fifth gain portion 164 on the sixth side surface 112c. In the example shown in the drawings, the fourth end surface 174 and the fifth end surface 175 completely overlap each other in an overlapping plane 179.

The sixth gain portion 166 is connected to the sixth side surface 112c while being tilted at an angle β3 with the perpendicular Q3 of the sixth side surface 112c in the plan view. In other words, it can be said that the extending direction of the sixth gain portion 166 has an angle β3 with the perpendicular Q3. That is, the angle of the fifth gain portion 164 with respect to the perpendicular Q3 and the angle of the sixth gain portion 166 with respect to the perpendicular Q3 are equal to each other within the range of the production tolerance. The angle β3 is, for example, an acute angle, and is equal to or larger than the critical angle. Thus, the sixth side surface 112c can totally reflect the light generated in the second gain region 160.

The sixth gain portion 166 is connected to the fourth side surface 112a while being tilted at an angle β1 with the perpendicular Q1 in the plan view. In other words, it can be said that the longitudinal direction of the sixth gain portion 166 has an angle β1 with the perpendicular Q1. In other words, the fourth gain portion 162 and the sixth gain portion 166 are connected to the fourth side surface 112a in the same direction, and are parallel to each other. More specifically, the extending direction of the fourth gain portion 162 and the extending direction of the sixth gain portion 166 are parallel to each other. Thus, the light 22 emitted from the first end surface 171 and the light 22 emitted from the sixth end surface 176 can be emitted in the same direction.

As described above, by setting the angles β2, β3 to be equal to or larger than the critical angle, and setting the angle β1 to be smaller than the critical angle, the reflectance of the fourth side surface 112a can be made lower than the reflectance of the fifth side surface 112b and the reflectance of the sixth side surface 112c. Thus, it is possible for the first end surface 171 provided to the fourth side surface 112a to become a third emitting section (a third emitting section 171) for emitting the light generated in the second gain region 160. It is possible for the sixth end surface 176 provided to the fourth side surface 112a to become a fourth emitting section (a fourth emitting section 176) for emitting the light generated in the second gain region 160. It is possible for the overlapping plane 178 between the end surfaces 172, 173 provided to the fifth side surface 112b to become a third reflecting section (a third reflecting section 178) for reflecting the light generated in the second gain region 160. It is possible for the overlapping plane 179 between the end surfaces 174, 175 provided to the sixth side surface 112c to become a fourth reflecting section (a fourth reflecting section 179) for reflecting the light generated in the second gain region 160.

In other words, the fourth gain portion 162 extends from the third emitting section 171 to the third reflecting section 178, the fifth gain portion 164 extends from the third reflecting section 178 to the fourth reflecting section 179, the sixth gain portion 166 extends from the fourth reflecting section 179 to the fourth emitting section 176. Therefore, it can be said that the second gain region 160 has a bracket shape (a U shape with corners) in the plan view.

It should be noted that the emitting sections 171, 176 can be covered by the antireflection film similarly to the emitting sections 151, 156 described above. Further, the reflecting sections 178, 179 can be covered by the reflecting film similarly to the reflecting sections 158, 159 described above. Thus, even under the condition of the incident angle, the refractive index, and so on with which the light generated in the second gain region 160 fails to be totally reflected by the reflecting sections 178, 179, it is possible to make the reflectance of the fourth side surface 112a lower than the reflectance of the fifth side surface 112b and the reflectance of the sixth side surface 112c in the wavelength band of the light generated in the second gain region 160. Further, by covering the fourth side surface 112a with the antireflection film, it can be possible to suppress the light generated in the second gain region 160 to be multiply reflected directly between the first end surface 171 and the sixth end surface 176. As a result, since it can be prevented to constitute the direct resonator, the laser oscillation of the light generated in the second gain region 160 can be suppressed.

Further, the angle β1 can be an angle larger than 0°. Thus, it is possible to prevent the light generated in the second gain region 160 from being multiply reflected directly between the first end surface 171 and the sixth end surface 176. As a result, since it can be prevented to constitute the direct resonator, the laser oscillation of the light generated in the second gain region 160 can be suppressed or prevented.

It should be noted that the angle β1 can be equal to 0° although not shown in the drawings. In other words, the extending directions of the gain portions 162, 166 can be parallel to the perpendicular Q1 in the plan view. As described above, even in such a configuration, by covering the fourth side surface 112a with the antireflection film, it is possible to suppress the light generated in the second gain region 160 to be multiply reflected directly between the first end surface 171 and the sixth end surface 176.

As shown in FIGS. 1 and 3, the fourth cladding layer 114 is formed on the second active layer 112. As the fourth cladding layer 114, a GaN layer or an AlGaN layer of the first conductivity type (e.g., the n type), for example, is used.

A pin diode is constituted, for example, by the n-type fourth cladding layer 114, the second active layer 112 with no impurity doped, and the p-type third cladding layer 110. Each of the third cladding layer 110 and the fourth cladding layer 114 is a layer having a forbidden-band width larger than that of the second active layer 112 and a refractive index smaller than that of the second active layer 112. The second active layer 112 has a function of generating the second light in response to the injection current by the second electrode 122 and the third electrode 124 and a function of guiding the second light while amplifying the second light. The third cladding layer 110 and the fourth cladding layer 114 sandwiching the second active layer 112 therebetween have a function of confine the injected carriers (electrons and holes) and the light therein (suppressing the leakage of carriers and light).

In the light emitting device 100, when applying a forward bias voltage of the pin diode between the second electrode 122 and the third electrode 124 (injecting electrical current), the second gain region 160 is generated in the second active layer 112, and there occurs recombination of electrons and holes in the second gain region 160. The recombination generates light. The stimulated emission occurs in a chained manner taking the light thus generated as a starting point, and the light intensity is amplified inside the second gain region 160 to which electrical current is injected.

For example, as shown in FIG. 5, the second light 12 generated in the fourth gain portion 162 and proceeding toward the fifth side surface 112b is amplified in the fourth gain portion 162, and is then reflected by the third reflecting section 178, and then proceeds through the fifth gain portion 164 toward the sixth side surface 112c. Then, the second light 12 is further reflected by the fourth reflecting section 179, then proceeds through the sixth gain portion 166, and is then emitted from the sixth end surface 176 as the second light 22. On this occasion, the light intensity is also amplified in the gain portions 164, 166. Similarly, the second light generated in the sixth gain portion 166 and proceeding toward the sixth side surface 112c is amplified in the sixth gain portion 166, and is then reflected by the fourth reflecting section 179, and then proceeds through the fifth gain portion 164 toward the fifth side surface 112b. Then, the second light is further reflected by the third reflecting section 178, then proceeds through the fourth gain portion 162, and is then emitted from the first end surface 171 as the second light 22. On this occasion, the light intensity is also amplified in the gain portions 162, 164.

It should be noted that some of the light generated in the fourth gain portion 162 is emitted directly from the first end surface 171 as the second light 22. Similarly, some of the light generated in the sixth gain portion 166 is emitted directly from the sixth end surface 176 as the second light 22. These lights are also amplified in the respective gain portions 162, 166 in a similar manner.

The wavelength of the first light generated in the first active layer 106 is, for example, no smaller than 435 nm and no larger than 485 nm. In this case, the first light is blue light. The wavelength of the second light generated in the second active layer 112 is, for example, no smaller than 485 nm and no larger than 570 nm. In this case, the second light is green light.

It should be noted that the wavelength of the first light and the wavelength of the second light can be equal to each other. For example, the wavelength of the first light and the wavelength of the second light are no smaller than 610 nm and no larger than 750 nm, and the first light and the second light can be red light. In this case, the active layers 106, 112 can have a multiple quantum well (MQW) structure having, for example, three quantum well structures each composed of an InGaP well layer and an InGaAlP barrier layer.

The first gain region 140 and the second gain region 160 do not overlap each other in the plan view as shown in FIG. 2. In the example shown in FIG. 2, the first gain region 140 is surrounded by the second gain region 160 and the first side surface 106a of the first active layer 106 in the plan view. The first emitting section 151 and the second emitting section 156 of the first gain region 140 are located between the third emitting section 171 and the fourth emitting section 176 of the second gain region 160. In the plan view, the distance D1 between the center of the first emitting section 151 and the center of the third emitting section 171 is, for example, about 40 μm. Similarly, in the plan view, the distance D2 between the center of the second emitting section 156 and the center of the fourth emitting section 176 is, for example, about 40 μm.

The first light 20 emitted from the first emitting section 151, the first light 20 emitted from the second emitting section 156, the second light 22 emitted from the third emitting section 171, and the second light 22 emitted from the fourth emitting section 176 can be emitted in the same direction. In the light emitting device 100, it is possible to adjust the angle α1 (see FIG. 4) and the angle β1 (see FIG. 5) so that the first light 20 and the second light 22 are emitted in the same direction.

As shown in FIGS. 1 and 3, the insulating layer 116 is formed so as to cover the upper surface and the side surfaces of the laminated body 130. As shown in FIG. 1, the insulating layer 116 is formed avoiding the side surface 130a of the laminated body 130. As the insulating layer 116, for example, an SiN layer or an SiON layer is used.

As shown in FIG. 3, the insulating layer 116 is provided with openings 116a, 116b, and 116c. The opening 116a is located at the first portions 132 of the laminated body 130. The opening 116b is located at the second portion 134 of the laminated body 130. The opening 116c is located at the third portion 136 of the laminated body 130.

The planar shape of the opening 116b is the same as, for example, the planar shape of the first gain region 140. The current channel between the electrodes 120, 122 is determined in accordance with, for example, the planar shape of the opening 116b, and as a result, the planar shape of the first gain region 140 is determined. Further, the planar shape of the opening 116c is the same as, for example, the planar shape of the second gain region 160. The current channel between the electrodes 122, 124 is determined in accordance with, for example, the planar shape of the opening 116c, and as a result, the planar shape of the second gain region 160 is determined.

The first electrodes 120 are electrically connected to the first cladding layer 104. The first electrodes 120 are located on the surface of the laminated body 130 on the opposite side to the substrate 102 side. In the example shown in FIG. 3, the first electrodes 120 are located on the upper surfaces 132a of the first portions 132 of the laminated body 130. Since the opening 116a is disposed, for example, the upper surface 132a has a portion exposed in the laminated body 130. As shown in FIG. 3, each of the first electrodes 120 can have a portion having contact with the upper surface 132a, and a portion having contact with the insulating layer 116 formed on the upper surface 132a.

It should be noted that, although the upper surface 132a is formed of the first cladding layer 104 in the example shown in the drawing, the upper surface 132a can be formed of a first contact layer (not shown) disposed between the first cladding layer 104 and each of the first electrodes 120. The first contact layer can have ohmic contact with each of the first electrodes 120.

As shown in FIGS. 1 and 2, the two first electrodes 120 are disposed, and as shown in FIG. 2, the second electrode 122 and the third electrode 124 are disposed between the two first electrodes 120 in the plan view. The planar shape of each of the first electrodes 120 is not particularly limited, but is a parallelogram shape in the example shown in FIG. 2. The width (the size in the Y-axis direction) of each of the first electrodes 120 is, for example, in a range of about 100 μm through 200 μm.

The first electrodes 120 are each one of the electrodes for injecting the current into the first active layer 106. As the first electrode 120, there can be used, for example, what is obtained by stacking a Ti layer, an Al layer, and an Au layer in this order from the laminated body 130 side.

The second electrode 122 is electrically connected to the second cladding layer 108 and the third cladding layer 110. The second electrode 122 is located on the surface of the laminated body 130 on the opposite side to the substrate 102 side. In the example shown in FIG. 3, the second electrode 122 is located on the upper surface 134*a* of the second portion 134 of the laminated body 130. Since the opening 116*b* is disposed, for example, the upper surface 134*a* has a portion exposed in the laminated body 130. As shown in FIG. 3, the second electrode 122 can have a portion having contact with the upper surface 134*a*, and a portion having contact with the insulating layer 116 formed on the upper surface 134*a*.

It should be noted that, although the upper surface 134*a* is formed of the second cladding layer 108 and the third cladding layer 110 in the example shown in the drawings, the upper layer 134*a* can be formed of a second contact layer (not shown) disposed between the cladding layers 108, 110 and the second electrode 122. The second contact layer can have ohmic contact with the second electrode 122.

As shown in FIG. 2, the second electrode 122 has a surface 122*a* larger than the first gain region 140 to thereby cover the first gain region 140 in the plan view. The surface 122*a* is the upper surface of the second electrode 122. As shown in FIG. 3, the first gain region 140 is located below an end portion 123 of the second electrode 122, the end portion 123 being located near to the second gain region 160 side. Specifically, as shown in FIG. 2, the first gain region 140 overlaps the end portion 123 of the second electrode 122 located near to the second gain region 160 side in the plan view.

The second electrode 122 covers the first gain region 140 along the first gain region 140 in the plan view. The width (the size in the Y-axis direction of the portions disposed along the gain portions 142, 146, and the size in the X-axis direction of the portion disposed along the gain portion 144) of the second electrode 122 is, for example, in a range of about 100 μm through 200 μm. The second electrode 122 is disposed so as to be surrounded by the third electrode 124 and the side surface 130*a* of the laminated body 130 in the plan view.

The second electrode 122 is the other of the electrodes for injecting current into the first active layer 106. Further, the second electrode 122 is one of the electrodes for injecting current into the second active layer 112. As the second electrode 122, there can be used, for example, what is obtained by stacking an Ni layer, a Pd layer, and an Au layer in this order from the laminated body 130 side.

The third electrode 124 is electrically connected to the fourth cladding layer 114. The third electrode 124 is located on the surface of the laminated body 130 on the opposite side to the substrate 102 side. In the example shown in FIG. 3, the third electrode 124 is located on the upper surface 136*a* of the third portion 136 of the laminated body 130. Since the opening 116*c* is disposed, for example, the upper surface 136*a* has a portion exposed in the laminated body 130. As shown in FIG. 3, the third electrode 124 can have a portion having contact with the upper surface 136*a*, and a portion having contact with the insulating layer 116 formed on the upper surface 136*a*.

It should be noted that although the upper surface 136*a* is formed of the fourth cladding layer 114 in the example shown in the drawings, the upper surface 136*a* can be formed of a third contact layer (not shown) disposed between the fourth cladding layer 114 and the third electrode 124. The third contact layer can have ohmic contact with the third electrode 124.

As shown in FIG. 2, the third electrode 124 has a surface 124*a* larger than the second gain region 160 to thereby cover the second gain region 160 in the plan view. The surface 124*a* is the upper surface of the third electrode 124. As shown in FIG. 3, the second gain region 160 is located below an end portion 125 of the third electrode 124, the end portion 125 being located near to the first gain region 140 side. Specifically, as shown in FIG. 2, the second gain region 160 overlaps the end portion 125 of the third electrode 124 located near to the first gain region 140 side in the plan view.

The third electrode 124 covers the second gain region 160 along the second gain region 160 in the plan view. The width (the size in the Y-axis direction of the portions disposed along the gain portions 162, 166, the size in the X-axis of the portion disposed along the gain portion 164) of the third electrode 124 is, for example, in a range of about 100 μm through 200 μm.

The third electrode 124 is the other of the electrodes for injecting current into the second active layer 112. As the third electrode 124, there can be used, for example, what is obtained by stacking a Ti layer, an Al layer, and an Au layer in this order from the laminated body 130 side.

As shown in FIGS. 2 and 3, the center in the width direction of the second electrode 122 and the center in the width direction of the opening 116*b* and the first gain region 140 can be shifted from each other when viewed from the stacking direction of the laminated body 130. Similarly, the center in the width direction of the third electrode 124 and the center in the width direction of the opening 116*c* and the second gain region 160 can be shifted from each other.

The light emitting device 100 according to the present embodiment can be applied to the light source for a projector, a monitor display, an illumination device, and a measuring device, for example.

The light emitting device 100 according to the present embodiment has, for example, the following features.

According to the light emitting device 100, the first electrodes 120, the second electrode 122, and the third electrode 124 are located on the surface of the laminated body 130 on the opposite side to the substrate 102 side. In other words, in the light emitting device 100, the electrodes 120, 122, and 124 are formed on one side of the laminated body 130. Therefore, it is possible to simplify the layout of the wiring lines electrically connected to the electrodes 120, 122, and 124 when mounting the light emitting device 100. More specifically, according to the light emitting device 100, it is possible to dispose a mounting board provided with the wiring lines on one side of the laminated body 130, and mount the light emitting device 100 on the mounting board so that the wiring lines and the electrodes 120, 122, and 124 are electrically connected to each other.

Further, in the light emitting device 100, since the electrodes 120, 122, and 124 are formed on one side of the laminated body 130, freedom flexibility of selecting the substrate material can be improved. Although which is limited to the substrate having electrical conductivity such as a GaN substrate or a silicon (111) substrate in the case of the light emitting device having the electrodes disposed on both sides of the substrate, according to the light emitting device 100, for example, an insulating substrate such as a sapphire substrate can be used as the substrate 102.

Further, in the light emitting device 100, the first active layer 106 and the second active layer 112 are formed on the same substrate 102. The first side surface 106*a* of the first active layer 106 and the fourth side surface 112*a* of the second active layer 112 are included in the side surface 130*a* of the laminated body 130. Therefore, it is possible to reduce the distance D1 between the first emitting section 151 disposed on the first side surface 106a and the third emitting section 171 disposed on the fourth side surface 112a. Similarly, it is possible to reduce the distance D2 between the second emitting section 156 disposed on the first side surface 106a and the fourth emitting section 176 disposed on the fourth side surface 112a. Thus, it is possible to make the lights 20, 22 respectively emitted from the emitting sections 151, 171 enter a single collecting lens (a microlens). Similarly, it is possible to make the lights 20, 22 respectively emitted from the emitting sections 156, 176 enter a single collecting lens. Therefore, according to the light emitting device 100, in the case of using the light emitting device 100 as the light source of the projector, the number of the collecting lenses can be reduced to thereby achieve the cost reduction.

As described above, according to the light emitting device 100, it is possible to achieve simple layout of the wiring lines to be electrically connected to the electrodes in installation and improve the flexibility of selecting the substrate material while achieving the cost reduction.

According to the light emitting device 100, the first gain region 140 is provided with the first gain portion 142 having the first emitting section 151, the third gain portion 146 having the second emitting section 156, and the second gain portion 144 connected to the first gain portion 142 and the third gain portion 146. The second gain region 160 is provided with the fourth gain portion 162 having the third emitting section 171, the sixth gain portion 166 having the fourth emitting section 176, and the fifth gain portion 164 connected to the fourth gain portion 162 and the sixth gain portion 166. Therefore, the distance between the emitting sections 151, 156 can be adjusted using the second gain portion 144. Further, the distance between the emitting sections 171, 176 can be adjusted using the fifth gain portion 164. Thus, in the light emitting device 100, in the case of using the light emitting device 100 as the light source of the projector, it is possible to easily adjust the distance between the emitting sections 151, 156 and the distance between the emitting sections 171, 176 in accordance with, for example, the size of the collecting lens or the interval of lens array (microlens array).

According to the light emitting device 100, it is possible to set the wavelength of the first light to a value no smaller than 435 nm and no larger than 485 nm, and the wavelength of the second light to be no smaller than 485 nm and no larger than 570 nm. In other words, it is possible to set the first light to blue light, and the second light to green light. Thus, it is possible to use the light emitting device 100 as the blue light source and the green light source of the projector. Therefore, the number of the light emitting devices can be reduced compared to the case of using respective light emitting devices for three light sources. Therefore, the number of lens arrays (microlens arrays) to which the light emitted from the light source is input can be reduced. As a result, the cost reduction can more surely be achieved.

According to the light emitting device 100, the first gain region 140 and the second gain region 160 do not overlap each other in the plan view. Therefore, in the light emitting device 100, the light loss in the overlapping portion can be reduced. For example, when the first gain region and the second gain region overlap each other in the plan view, the light loss in the overlapping portion may be increased in some cases.

According to the light emitting device 100, the first gain region 140 is surrounded by the second gain region 160 and the first side surface 106a in the plan view. Thus, the length of the second gain region 160 can be set to be greater than the length of the first gain region 140. For example, the first light generated in the first gain region 140 is blue light, and the second light generated in the second gain region 160 is green light. Here, in some cases, the second active layer 112 provided with the second gain region 160 for generating green light may be in large strain compared to the first active layer 106 provided with the first gain region 140 for generating blue light. Further, in some cases, a strong electrical field (piezoelectric field) caused by the piezoelectric effect may be applied to the second active layer 112 due to such strain, and the radiative recombination probability of electrons and holes may be degraded. In other words, the gain of green light may be lower than that of blue light in some cases. According to the light emitting device 100, as described above, the length of the second gain region 160 can be set to be greater than the length of the first gain region 140. Therefore, in the case in which the second light generated in the second gain region 160 is the green light, the length of the gain region of the green light with low gain can be made greater than that of the other color, and the intensity and the emission efficiency of green light can be increased. Therefore, in the case of using such a light emitting device 100 to the projector, since the intensity and the emission efficiency of the green light having a high luminous sensitivity can be increased, a projector with higher luminous flux can be realized.

According to the light emitting device 100, the first gain region 140 is located below the end portion 123 of the second electrode 122, the end portion 123 being located near to the second gain region 160 side, and the second gain region 160 is located below the end portion 125 of the third electrode 124, the end point 125 being located near to the first gain region 140 side. Therefore, the distance D1 between the first emitting section 151 and the third emitting section 171 can more surely be decreased. Similarly, the distance D2 between the second emitting section 156 and the fourth emitting section 176 can be decreased. Thus, it is possible to more surely make the lights respectively emitted from the emitting sections 151, 171 enter a single collecting lens. Similarly, it is possible to make the lights respectively emitted from the emitting sections 156, 176 enter a single collecting lens. Therefore, according to the light emitting device 100, in the case of using the light emitting device 100 as the light source of the projector, the number of the microlenses can more surely be reduced to thereby achieve the cost reduction.

2. Method of Manufacturing Light Emitting Device

Figure 6:
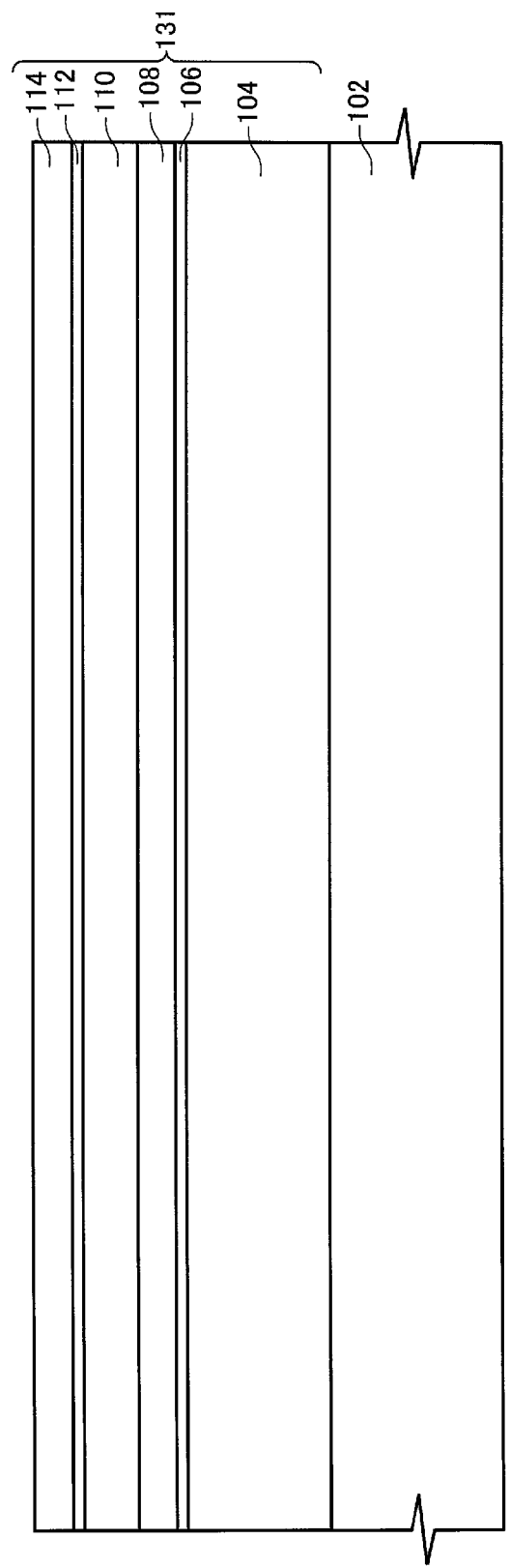
FIG. 6 is a cross-sectional view schematically showing a manufacturing process of the light emitting device according to the embodiment.
Figure 7:
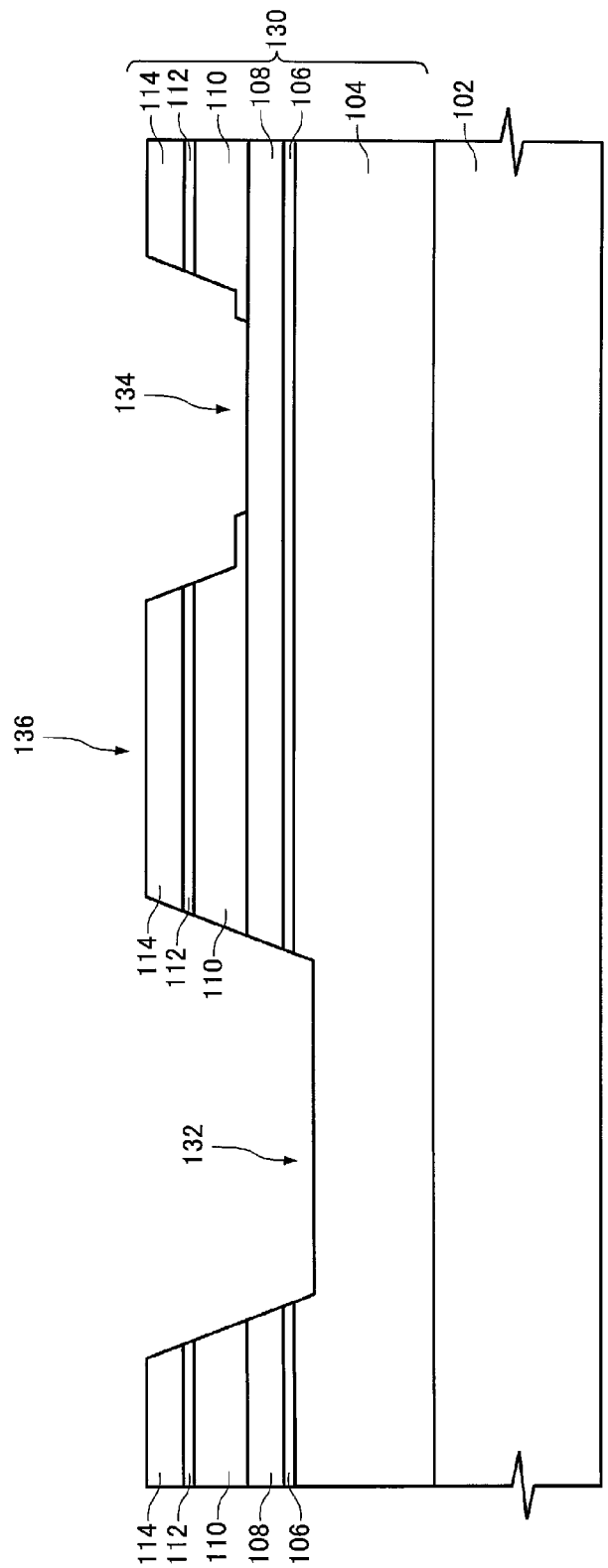
FIG. 7 is a cross-sectional view schematically showing the manufacturing process of the light emitting device according to the embodiment.

Then, a method of manufacturing the light emitting device according to the present embodiment will be explained with reference to the accompanying drawings. FIGS. 6 and 7 are cross-sectional views schematically showing the manufacturing process of the light emitting device 100 according to the present embodiment, and each corresponds to FIG. 3.

As shown in FIG. 6, the first cladding layer 104, the first active layer 106, the second cladding layer 108, the third cladding layer 110, the second active layer 112, and the fourth cladding layer 114 are grown epitaxially on the substrate 102 in this order. Thus, a laminated body 131 can be formed. As the method of epitaxially growing the layers, there can be used, for example, a metal organic chemical vapor deposition (MOCVD) method, and a molecular beam epitaxy (MBE) method.

As shown in FIG. 7, the laminated body 131 is patterned to form the laminated body 130 having the first portion 132, the second portion 134, and the third portion 136. The patterning is performed using, for example, the photolithography technology and the etching technology.

As shown in FIG. 3, the insulating layer (not shown) is deposited on the laminated body 130, and is then patterned to thereby form the insulating layer 116 provided with the openings 116a, 116b, and 116c. The insulating layer is deposited using, for example, a chemical vapor deposition (CVD) method. The patterning is performed using, for example, the photolithography technology and the etching technology.

Then, the first electrodes 120, the second electrode 122, and the third electrode 124 are formed on the first portion 132, the second portion 134, and the third portion 136, respectively. In this process, firstly, a photo resist is patterned using the photolithography technology to thereby expose only the upper surface of the regions to be provided with the electrodes, and cover the upper surface of the regions not to be provided with the electrodes including the opening sections 30, 32, 34, and 36. Then, a conductive layer is evaporated on the entire surface using a vacuum evaporation method. Then, the conductive layer on the regions not to be provided with the electrodes is removed (liftoff)) together with the resist. The order of forming the electrodes 120, 122, and 124 is not particularly limited. In an example of the light emitting device 100, the electrodes 120 and the electrode 124, which are connected to the layers with the same conductivity type, can be formed simultaneously.

The light emitting device 100 according to the present embodiment can be manufactured by the processes described hereinabove.

According to the method of manufacturing the light emitting device 100, it is possible to achieve simple layout of the wiring lines to be electrically connected to the electrodes in installation and improve the flexibility of selecting the substrate material while achieving the cost reduction.

3. Modified Examples of Light Emitting Device

3.1. Light Emitting Device According to First Modified Example

Figure 8:
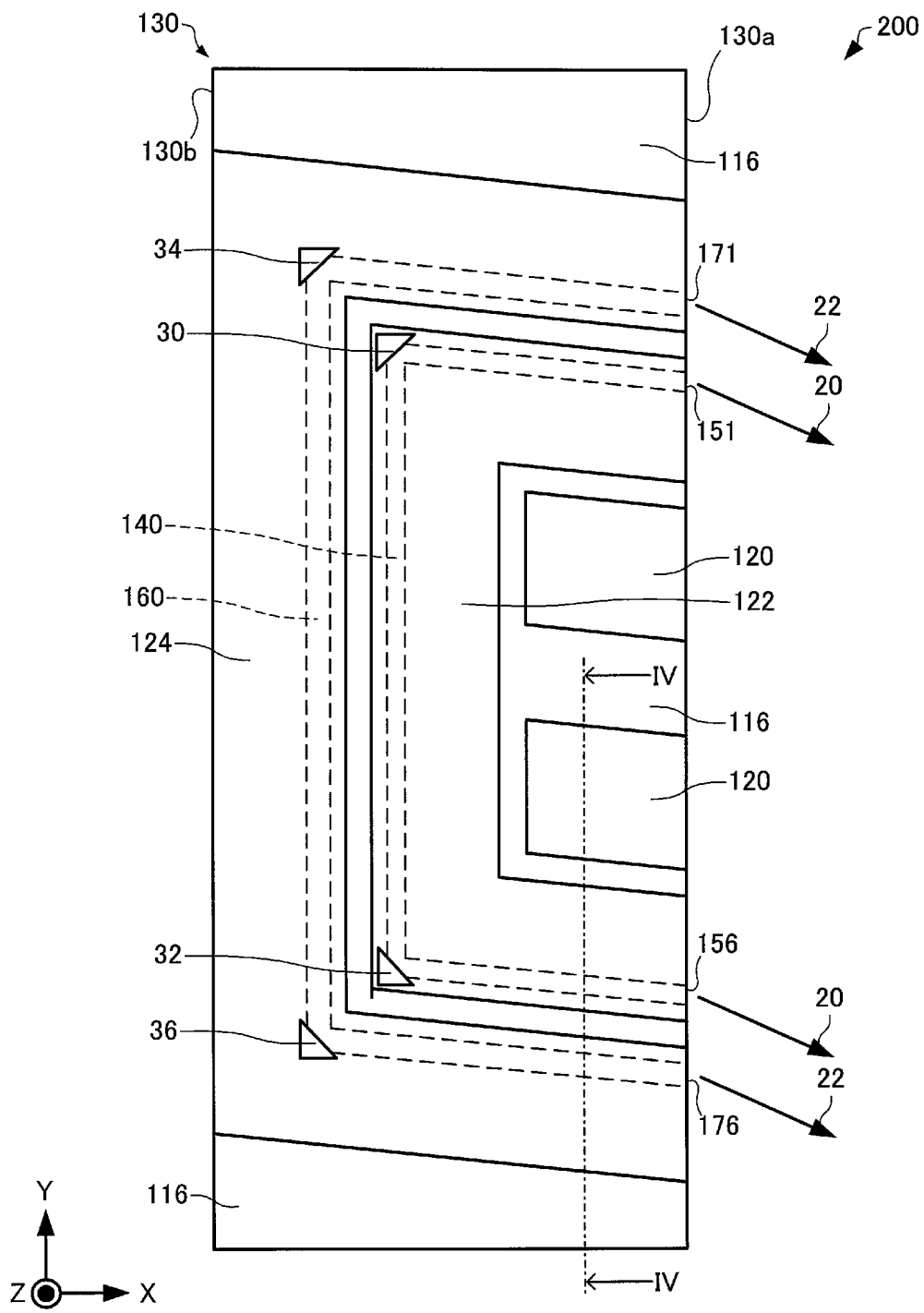
FIG. 8 is a plan view schematically showing a light emitting device according to a first modified example of the embodiment.
Figure 9:
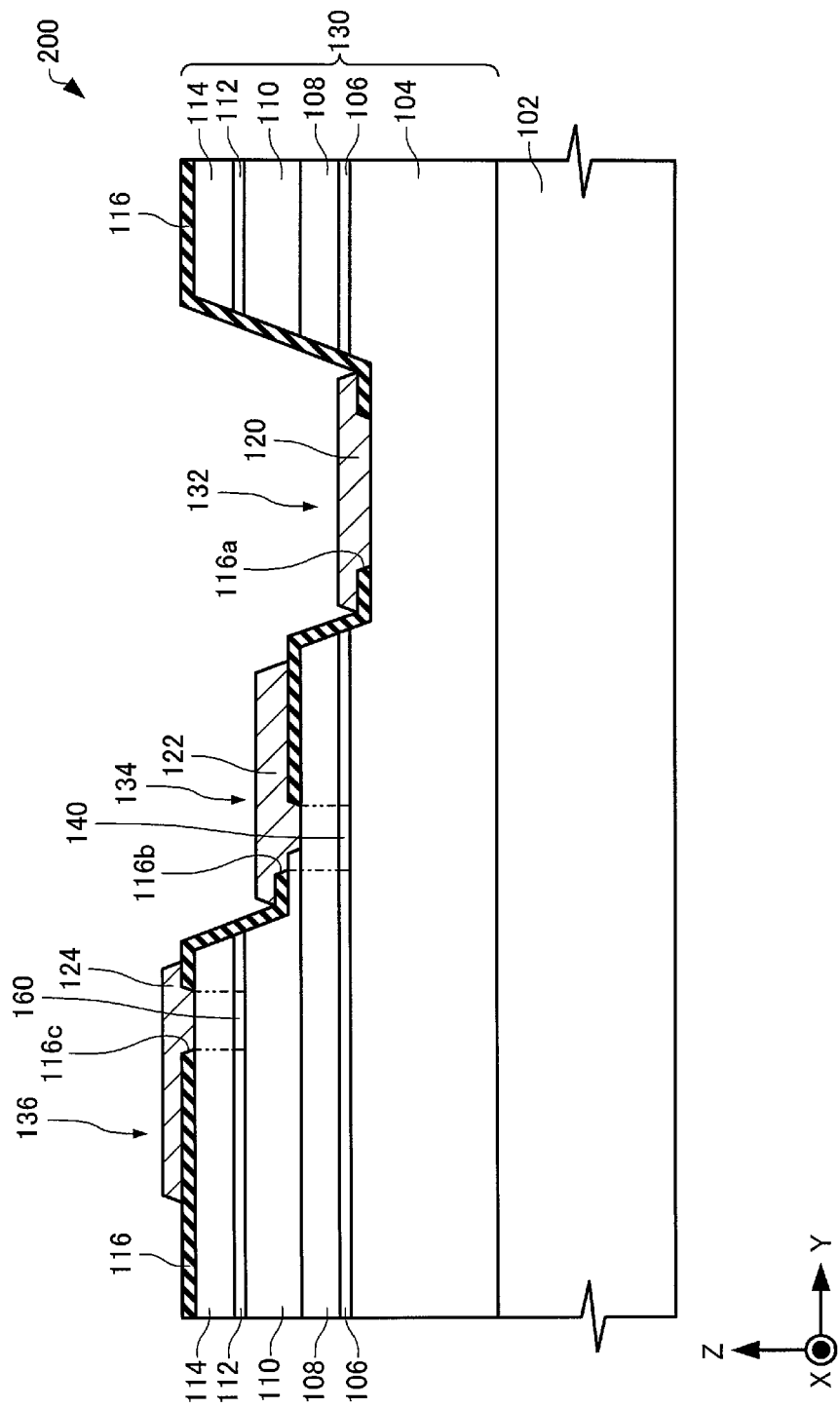
FIG. 9 is a cross-sectional view schematically showing the light emitting device according to the first modified example of the embodiment.

Then, a light emitting device according to a first modified example of the present embodiment will be explained with reference to the accompanying drawings. FIG. 8 is a plan view schematically showing a light emitting device 200 according to the first modified example of the present embodiment. FIG. 9 is a cross-sectional view along the IV-IV line shown in FIG. 8 schematically showing the light emitting device 200 according to the first modified example of the present embodiment. It should be noted that in FIGS. 8 and 9, the X axis, the Y axis, and the Z axis are shown as the three axes perpendicular to each other.

Hereinafter, in the light emitting device 200 according to the first modified example of the present embodiment, the constituents thereof having the same functions as those of the constituents of the light emitting device 100 according to the present embodiment will be denoted with the same reference symbols, and the detailed explanation thereof will be omitted.

As shown in FIG. 2, in the example of the light emitting device 100, the two first electrodes 120 are disposed, and the gain regions 140, 160 (the electrodes 122, 124) are disposed between the two first electrodes 120.

In contrast, in the light emitting device 200, the first electrodes 120 are disposed so as to be surrounded by the first gain region 140 (the second electrode 122) and the side surface 130a of the laminated body 130 in the plan view as shown in FIG. 8.

According to the light emitting device 200, it is possible to reduce the size in the Y-axis direction while keeping the length of the gain regions 140, 160, for example, compared to the light emitting device 100. In other words, according to the light emitting device 200, downsizing can be achieved while keeping the length of the gain regions 140, 160.

3.2. Light Emitting Device According to Second Modified Example

Figure 10:
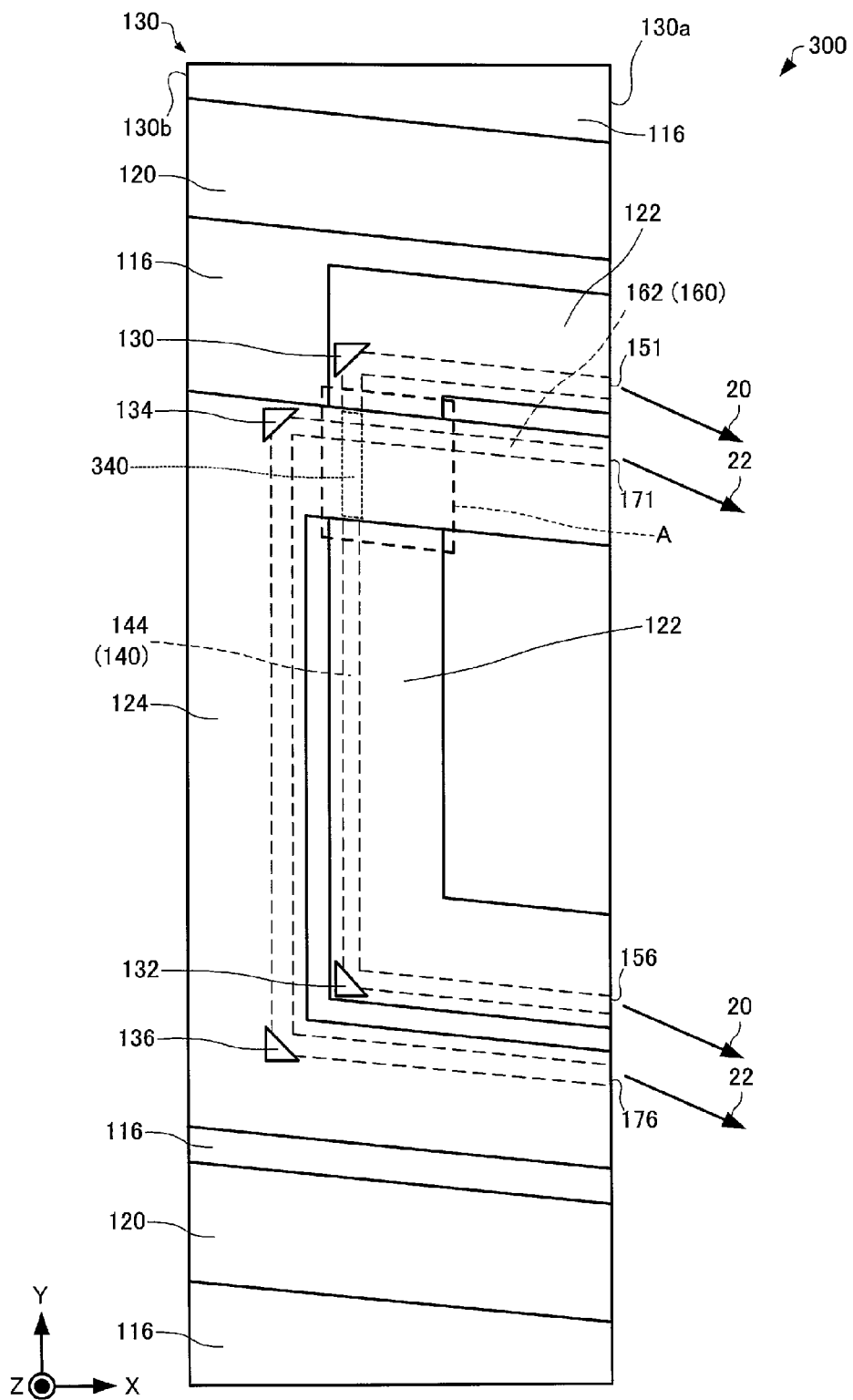
FIG. 10 is a plan view schematically showing alight emitting device according to a second modified example of the embodiment.
Figure 11:
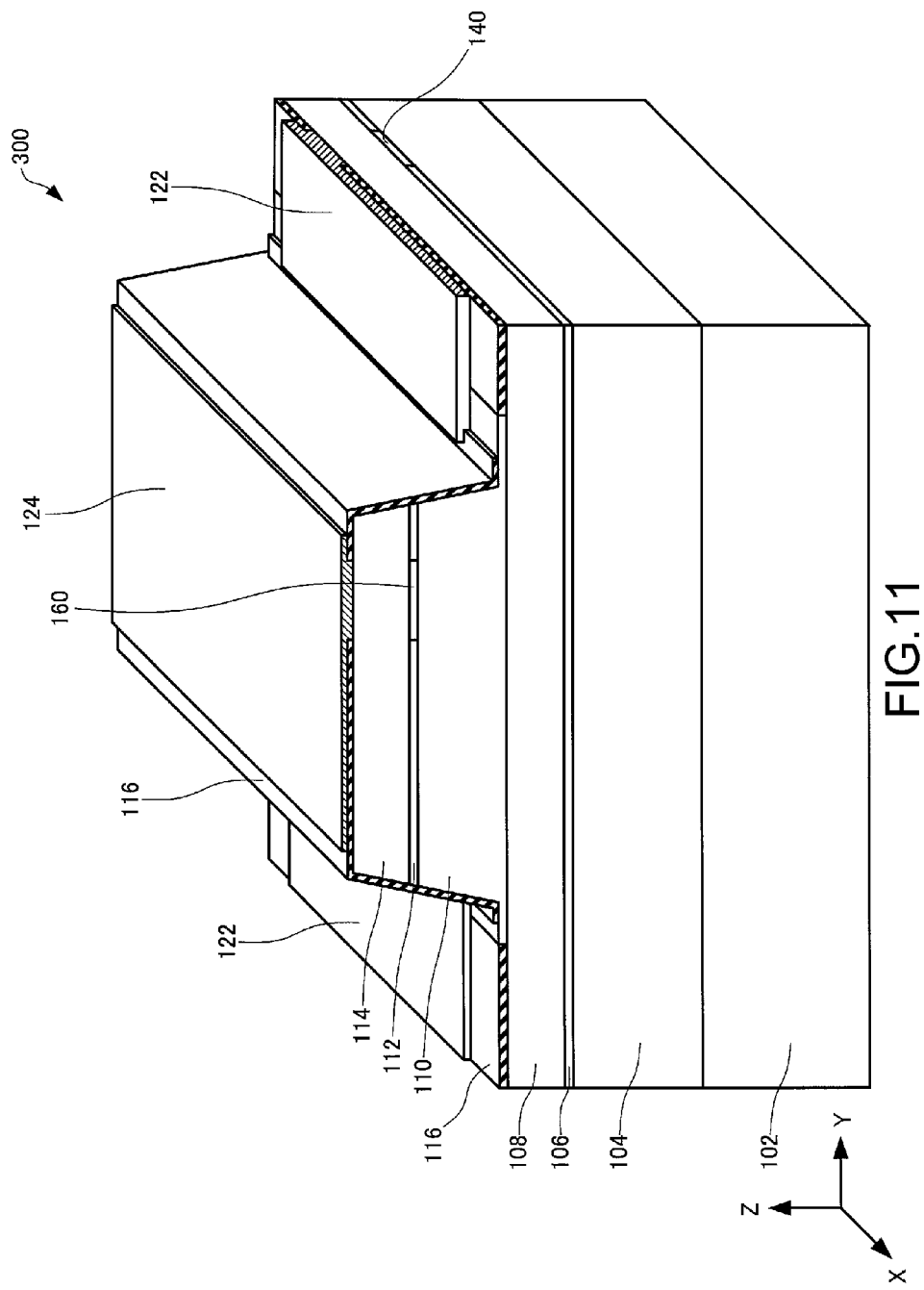
FIG. 11 is a cross-sectional perspective view schematically showing the light emitting device according to the second modified example of the embodiment.

Then, a light emitting device according to a second modified example of the present embodiment will be explained with reference to the accompanying drawings. FIG. 10 is a plan view schematically showing a light emitting device 300 according to the second modified example of the present embodiment. FIG. 11 is a cross-sectional perspective view schematically showing the light emitting device 300 according to the second modified example of the present embodiment, and is an enlarged view of a region A surrounded by the thick dotted line shown in FIG. 10. It should be noted that in FIGS. 10 and 11, the X axis, the Y axis, and the Z axis are shown as the three axes perpendicular to each other.

Hereinafter, in the light emitting device 300 according to the second modified example of the present embodiment, the constituents thereof having the same functions as those of the constituents of the light emitting device 100 according to the present embodiment will be denoted with the same reference symbols, and the detailed explanation thereof will be omitted.

In the example of the light emitting device 100, the first gain region 140 is surrounded by the second gain region 160 and the first side surface 106a of the first active layer 106 in the plan view as shown in FIG. 2.

In contrast, in the light emitting device 300, the second gain portion 144 of the first gain region 140 has a gap section 340 in which the second gain portion 144 is divided, and the fourth gain portion 162 of the second gain region 160 is disposed passing through the gap section 340 in the plan view as shown in FIGS. 10 and 11.

The second electrode 122 is not formed above the gap section 340. Specifically, apart of the second electrode 122 located above the second gain portion 144 is divided, and the third electrode 124 is disposed in the part in which the second electrode 122 is divided in the plan view.

According to the light emitting device 300, similarly to the light emitting device 100, it is possible to simplify the layout of the wiring lines electrically connected to the electrodes when mounting and improve the flexibility of selecting the substrate material.

It should be noted that although not shown in the drawings, the sixth gain portion 166 of the second gain region 160 can be disposed passing through the gap section 340 in the plan view instead of the fourth gain portion 162.

3.3. Light Emitting Device According to Third Modified Example

Figure 12:
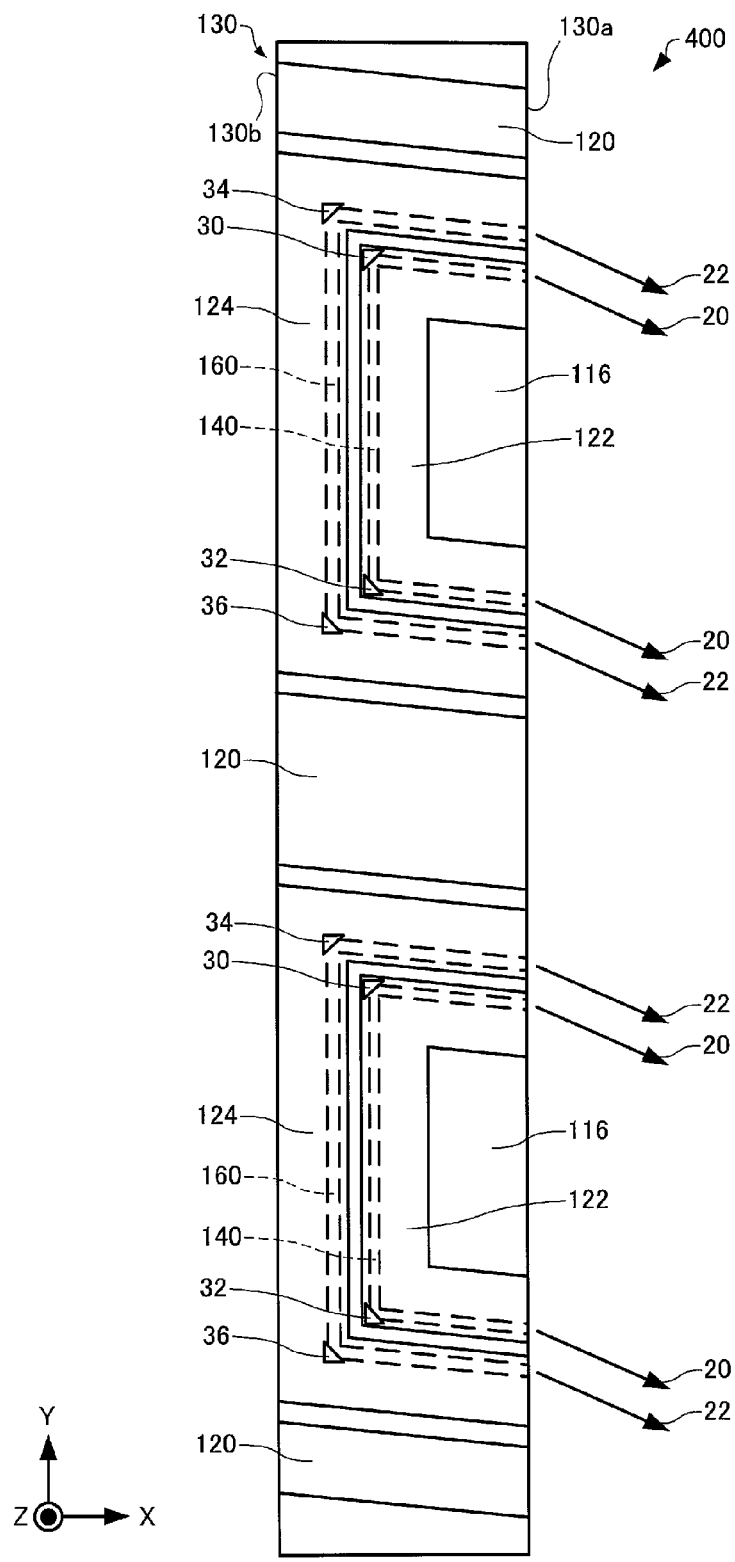
FIG. 12 is a plan view schematically showing alight emitting device according to a third modified example of the embodiment.

Then, a light emitting device according to a third modified example of the present embodiment will be explained with reference to the accompanying drawing. FIG. 12 is a plan view schematically showing a light emitting device 400 according to the third modified example of the present embodiment. It should be noted that in FIG. 12, the X axis, the Y axis, and the Z axis are shown as the three axes perpendicular to each other.

Hereinafter, in the light emitting device 400 according to the third modified example of the present embodiment, the constituents thereof having the same functions as those of the constituents of the light emitting device 100 according to the present embodiment will be denoted with the same reference symbols, and the detailed explanation thereof will be omitted.

In the example of the light emitting device 100, as shown in FIG. 2, the single first gain region 140 and the single second gain region 160 are disposed.

In contrast, in the example of the light emitting device 400, as shown in FIG. 12, a plurality of first gain regions 140 and a plurality of second gain regions 160 are disposed. In the example shown in the drawing, two first gain regions 140 are arranged along the Y axis, and the two second gain regions 160 are arranged along the Y axis.

The number of the second electrodes 122 disposed and the number of the opening sections 30, 32 disposed each correspond to the number of the first gain regions 140. The number of the third electrodes 124 disposed and the number of the opening sections 34, 36 disposed each correspond to the number of the second gain regions 160. In the example shown in the drawing, three first electrodes 120 are disposed, and one of the three first electrodes 120 is disposed between the two second gain regions 160.

According to the light emitting device 400, a higher output can be achieved compared to the light emitting device 100.

4. Light Source Module

Figure 13:
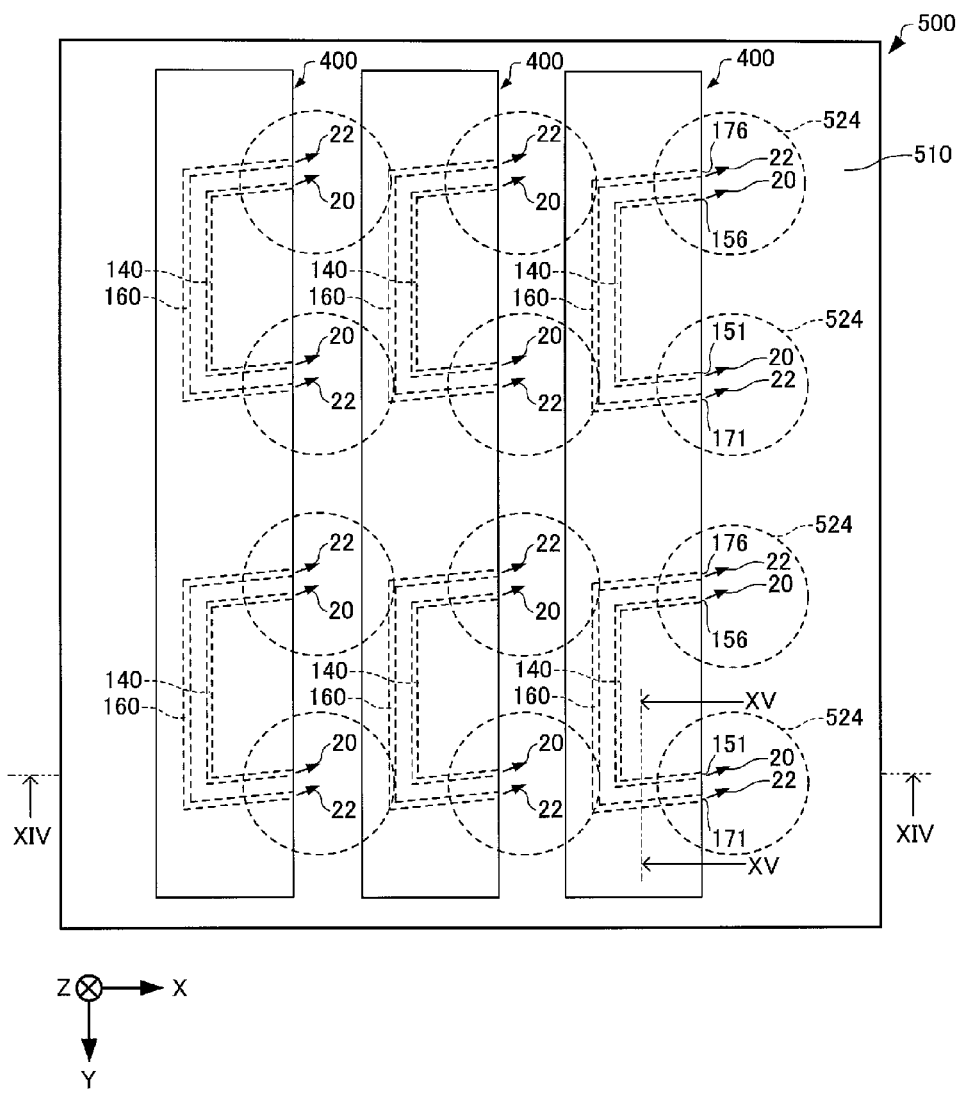
FIG. 13 is a plan view schematically showing alight source module according to the embodiment.
Figure 14:
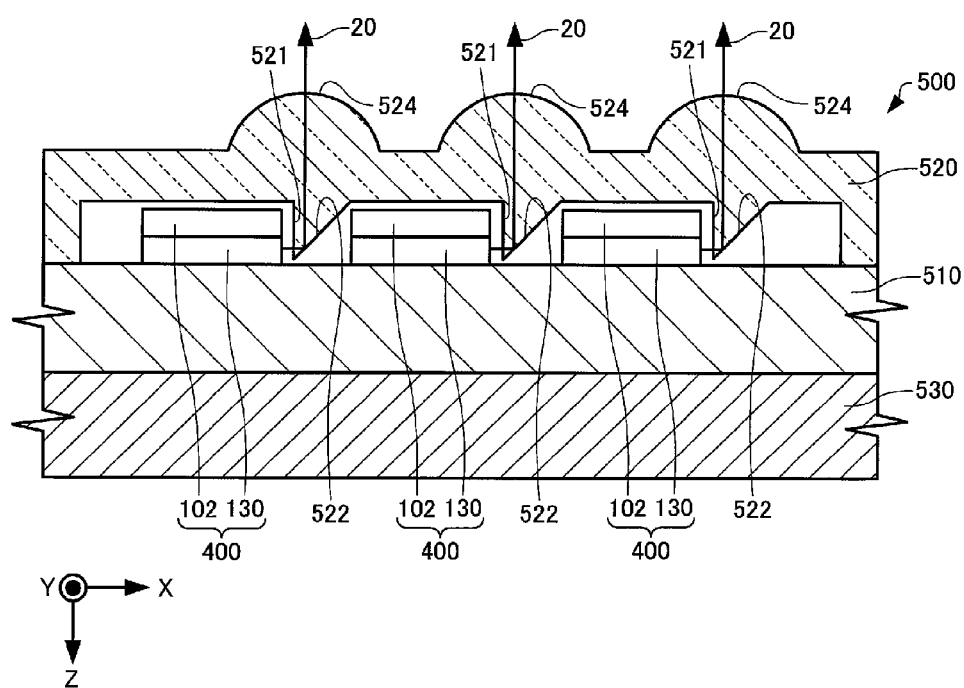
FIG. 14 is a cross-sectional view schematically showing a light source module according to the embodiment.
Figure 15:
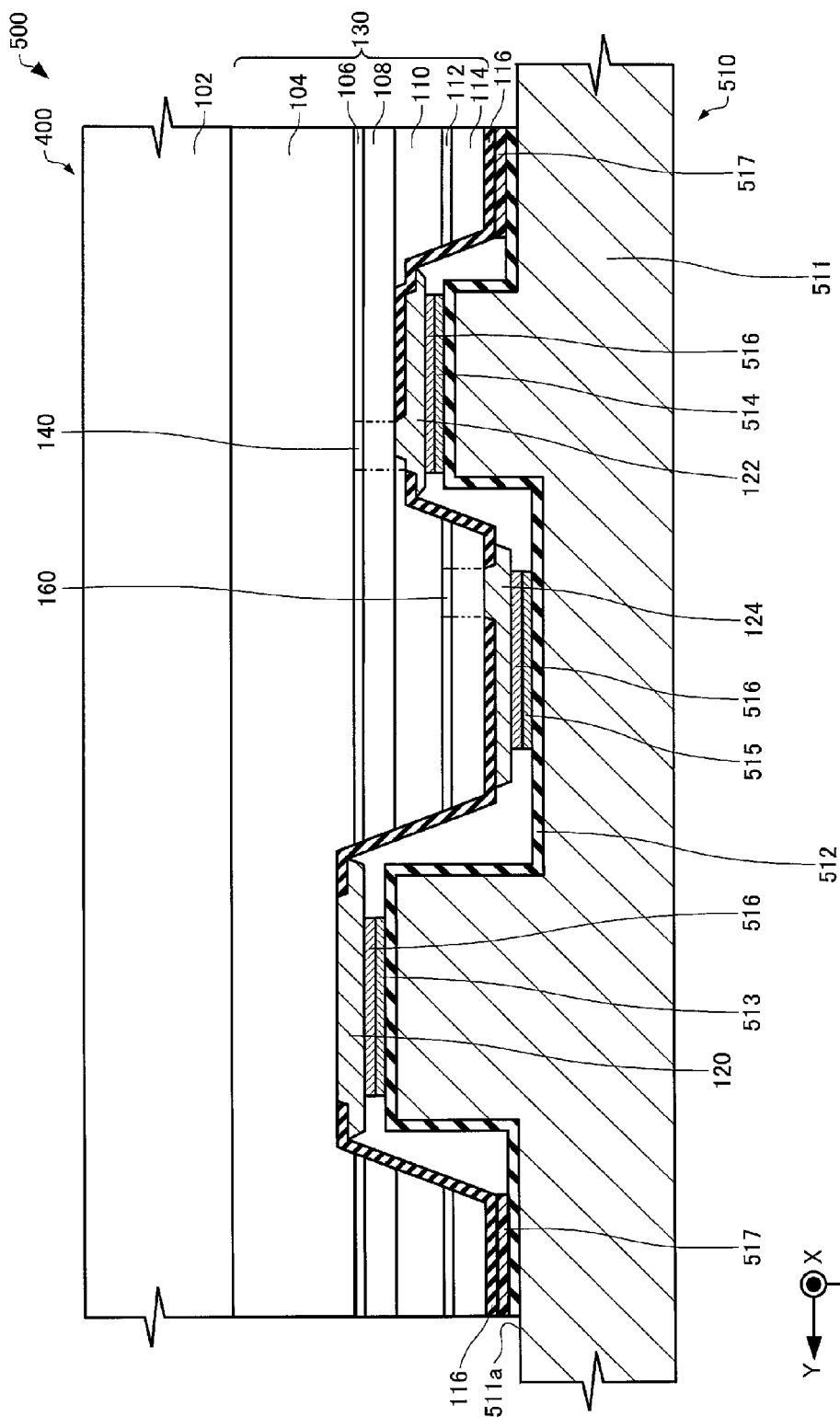
FIG. 15 is a cross-sectional view schematically showing the light source module according to the embodiment.

Then, a light source module according to the present embodiment will be explained with reference to the accompanying drawings. FIG. 13 is a plan view schematically showing the light source module 500 according to the present embodiment. FIG. 14 is a cross-sectional view along the XIV-XIV line shown in FIG. 13 schematically showing the light source module 500 according to the present embodiment. FIG. 15 is a cross-sectional view along the XV-XV line shown in FIG. 13 schematically showing a light source module 500 according to the present embodiment. It should be noted that in FIG. 13, the light emitting devices 400 and a mounting substrate 510 are shown in a simplified manner with a lens array 520 and a heatsink 530 omitted for the sake of convenience. Further, in FIG. 14, the light emitting devices 400 and the mounting substrate 510 are shown in a simplified manner. Further, in FIG. 15, the lens array 520 and the heatsink 530 are omitted. Further, in FIGS. 13 through 15, the X axis, the Y axis, and the Z axis are shown as the three axes perpendicular to each other.

As shown in FIGS. 13 through 15, the light source module 500 can include the mounting substrate 510, the lens array (the microlens array) 520, the heatsink 530, and the light emitting devices according to the embodiment of the invention. In the example described below, the light source module 500 including the light emitting devices 400 as the light emitting device according to the embodiment of the invention will be explained.

The light emitting devices 400 are mounted on the mounting substrate 510. As shown in FIG. 15, the mounting substrate 510 can include a support substrate 511, an insulating layer 512, and wiring lines 513, 514, and 515.

As the support substrate 511, a silicon substrate, for example, is used. The support substrate 511 has a surface 511a facing the light emitting devices 400.

The insulating layer 512 is formed on the surface 511a of the support substrate 511. As the insulating layer 512, for example, an SiO$_2$ layer is used.

The insulating layer 512 is provided with the wiring lines 513, 514, and 515. The wiring line 513 is electrically connected to the first electrode 120 via a bonding member 516. The wiring line 514 is electrically connected to the second electrode 122 via the bonding member 516. The wiring line 515 is electrically connected to the third electrode 124 via the bonding member 516. It is also possible for the wiring lines 513, 514, and 515 to have shapes corresponding to the shapes of the electrodes 120, 122, and 124, respectively, in the plan view. It is possible to inject current individually to each of the electrodes 120, 122, and 124 using the wiring lines 513, 514, and 515.

As described above, the width of the electrodes 120, 122, and 124 is in a range of about 100 µm through 200 µm. Therefore, it is possible to provide a sufficient contact area between each of the electrodes 120, 122, and 124 and the bonding member 516. Thus, it is possible to prevent the bonding member 516 from running off the electrodes 120, 122, and 124 before curing when bonding. Further, the bonding strength between the electrodes 120, 122, and 124 and the wiring lines 513, 514, and 515 can be increased. As the material of the wiring lines 513, 514, and 515, there can be cited, for example, copper, aluminum, and gold. As the material of the bonding member 516, there can be cited, for example, silver paste.

As shown in FIG. 15, it is also possible to dispose a bonding member 517 between the insulating layer 116 of the light emitting device 400 and the insulating layer 512 of the mounting substrate 510. The insulating layer 116 and the insulating layer 512 can be bonded with the bonding member 517. Thus, the bonding strength between the light emitting devices 400 and the mounting substrate 510 can be increased. As the material of the bonding member 517, there can be cited, for example, polysilsesquioxane (PSQ).

The light emitting devices 400 are mounted on the mounting substrate 510. The light emitting devices 400 are each mounted in a junction-down state. Specifically, the light emitting devices 400 are mounted so that the laminated body 130 side provided with the pin junction faces to the mounting substrate 510 side (downward in FIG. 14) instead of the substrate 102 side. Thus, heat generated when injecting the current into the light emitting devices 400 can promptly be released via the mounting substrate 510 and the heatsink 530 with high thermal conductivity instead of the substrate 102.

As shown in FIGS. 13 and 14, a plurality of light emitting devices 400 is disposed. In the example shown in the drawings, three light emitting devices 400 are arranged along the X axis.

As shown in FIG. 14, the lens array 520 is supported by the mounting substrate 510. The material of the lens array 520 is, for example, glass. The lens array 520 can include transmitting surfaces (planes of incidence of light) 521, reflecting surfaces 522, and collecting lenses (microlenses) 524.

As shown in FIG. 14, the transmitting surfaces 521 are each perpendicular to the optical axes of the first light 20 and the second light 22 emitted from the light emitting device 400, when the emission directions of the lights 20, 22 are perpendicular to the side surface 130a. Further, the reflecting surface 522 is disposed so as to form an angle of 45° with the transmitting surface 521. It is also possible to provide the transmitting surface 521 with an antireflection film and to provide the reflecting surface 522 with a reflecting film. Thus, the light loss in the transmitting surface 521 and the reflecting surface 522 can be reduced.

As shown in FIG. 14, the light emitted from the light emitting device 400 can be reflected by the reflecting surface 522 after transmitting through the transmitting surface 521. It should be noted that, when the emission direction of the first light 20 and the second light 22 is not perpendicular to the side surface 130a, the direction of the optical axis is converted into a direction perpendicular to the side surface 130a by refracting the first light 20 and the second light 22 in the transmitting surface 521, and thus, it is possible to reflect the first light 20 and the second light 22 by the reflecting surface 522. By the light being reflected by the reflecting surface 522, the proceeding direction of the light is deflected toward the collecting lens 524.

There is a plurality of collecting lenses 524. The collecting lenses 524 are arranged two-dimensionally corresponding to the emitting sections 151, 171 and the emitting sections 156, 176. At least some of the collecting lenses 524 are each disposed at a position overlapping the transmitting surface 521 and the reflecting surface 522 in the plan view. Further, by disposing the transmitting surface 521 close to the emitting sections 151, 171 or the emitting sections 156, 176, the collecting lenses 524 can be disposed at the position overlapping the emitting sections 151, 171 or the emitting sections 156, 176 in the plan view as shown in FIG. 13. Thus, it is possible for the first light 20 as blue light and the second light 22 as green light, for example, to enter the collecting lens 524 without enlarging the collecting lens 524. Since the radiation angle of the light having entered the collecting lens 524 is controlled (collected, collimated, decreased in radiation angle, and so on), the light can be overlapped (partially overlapped). Thus, it is possible to irradiate, for example, the liquid crystal light valve with uniformity.

The heatsink 530 is disposed on an opposite surface of the mounting substrate 510 to the surface thereof on which the light emitting devices 400 are mounted. The heatsink 530 can be bonded to the mounting substrate 510. As the material of the heatsink 530, there can be cited, for example, copper, molybdenum, aluminum nitride, and boron oxide. Due to the heatsink 530, the heat radiation property of the light emitting devices 400 can be improved.

According to the light source module 500, it is possible to include the light emitting devices 400 each having the electrodes 120, 122, and 124 formed on one side of the laminated body 130. Therefore, the layout of the wiring lines 513, 514, and 515 electrically connected to the electrodes 120, 122, and 124 can be simplified. Further, since the mounting process can be made easy, improvement of the turn-around time (TAT) of the mounting process, and reduction of the mounting cost can be achieved.

According to the light source module 500, the first light 20 as blue light and the second light 22 as green light, for example, are input to the same collecting lens 524. Therefore, in the case of using the light source modules 500 as the light source of the projector, the number of lens arrays can be decreased to thereby achieve the cost reduction.

5. Projector

Figure 16:
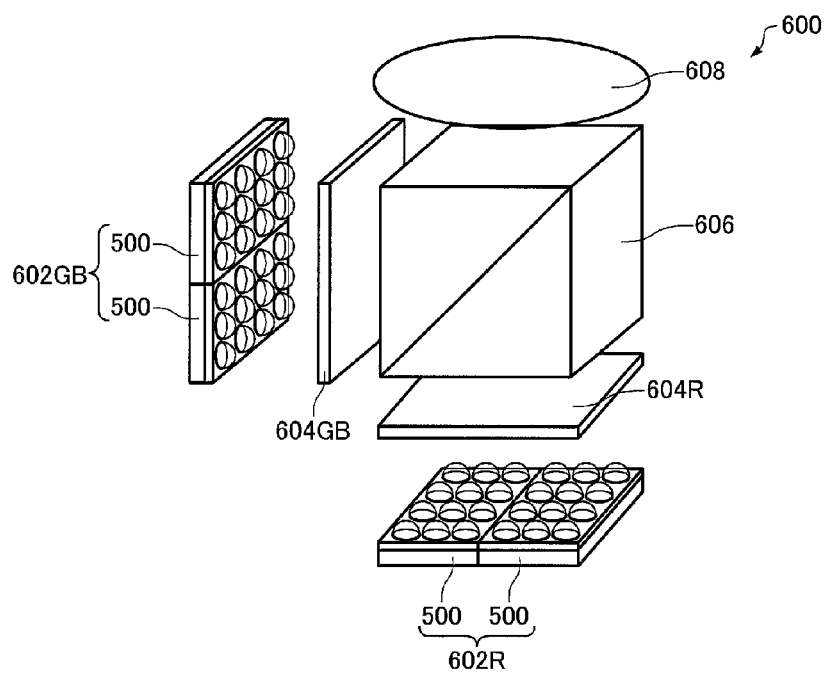
FIG. 16 is a perspective view schematically showing a projector according to the embodiment.
Figure 17:
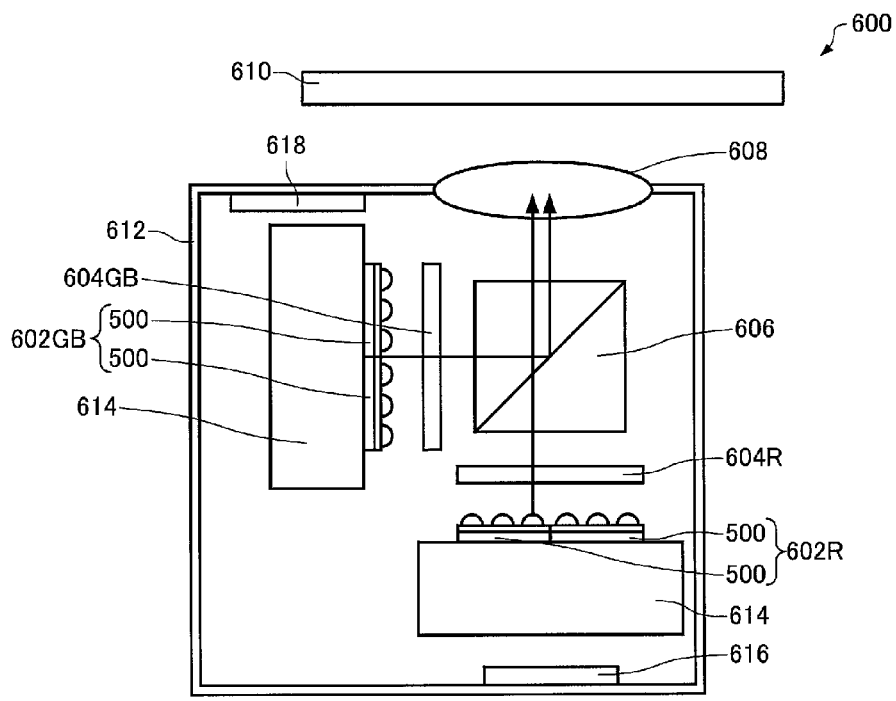
FIG. 17 is a diagram schematically showing the projector according to the embodiment.

Then, a projector according to the present embodiment will be explained with reference to the accompanying drawings. FIG. 16 is a perspective view schematically showing a projector 600 according to the present embodiment. FIG. 17 is a diagram schematically showing the projector 600 according to the present embodiment. It should be noted that in FIG. 16, a housing 612, a heatsink 614, fans 616, 618 are omitted, and the light source module 500 is shown in a simplified manner for the sake of convenience. Further, in FIG. 17 the light source module 500 is shown in a simplified manner.

As shown in FIGS. 16 and 17, the projector 600 includes first light source module 602GB, second light source module 602R, transmissive liquid crystal light valves (light modulation devices) 604GB, 604R, and a projection lens (a projection device) 608. Further, the projector 600 can include a dichroic prism (a colored light combining section) 606, a housing 612, a heatsink 614, an intake fan 616, and an exhaust fan 618.

The housing 612 can house the light source modules 602GB, 602R, the liquid crystal light valves 604GB, 604R, the dichroic prism 606, and the heatsink 614.

The first light source module 602GB is configured using the light source module 500. In the example shown in the drawings, the first light source module 602GB is composed of the two light source modules 500 arranged in parallel to each other. The first light source module 602GB is capable of emitting green light and blue light. More specifically, the first light 20 (see FIG. 13) emitted from the emitting sections 151, 156 is blue light, and the second light 22 (see FIG. 13) emitted from the emitting sections 171, 176 is green light. The lights 20, 22 emitted from the emitting sections 151, 156, 171, and 176 are collected by the lens array 520 as described above.

The second light source module 602R is configured using the light source module 500. In the example shown in the drawings, the second light source module 602R is composed of the two light source modules 500 arranged in parallel to each other. The second light source module 602R is capable of emitting the red light. More specifically, the first light 20 (see FIG. 13) emitted from the emitting sections 151, 156, and the second light 22 (see FIG. 13) emitted from the emitting sections 171, 176 are red light. The lights 20, 22 emitted from the emitting sections 151, 156, 171, and 176 are collected by the lens array 520 as described above. It should be noted that the second light source module 602R can be formed of a light source module using light emitting devices each having only the laminated body 130 formed by stacking only the first cladding layer, the first active layer, and the second cladding layer, the first electrode electrically connected to the first cladding layer, and the second electrode connected to the second cladding layer, and each generating or emitting only the first lights 10, 20.

The light source modules 602GB, 602R are disposed on the heatsink 614. The material of the heatsink 614 is, for example, copper and aluminum. The heat radiation property of the light source modules 602GB, 602R can be improved by the heatsink 614.

The intake fan 616 and the exhaust fan 618 are provided to the housing 612. The heat radiation property of the light source modules 602GB, 602R can be improved by the intake fan 616 and the exhaust fan 618.

The lights emitted from the light source modules 602GB, 602R (the lights with the radiation angle controlled by the lens array) enter the liquid crystal light valves 604GB, 604R, respectively. The liquid crystal light valves 604GB, 604R respectively modulate the incident lights in accordance with image information. Then, the projection lens 608 magnifies the images formed by the liquid crystal light valves 604GB, 604R, and projects them on a screen 610. In the example shown in FIG. 17, the projection lens 608 is provided to the housing 612.

The dichroic prism 606 is capable of combining the lights transmitting through the liquid crystal light valves 604GB, 604R and guiding the combined light to the projection lens 608.

More specifically, the colored light modulated by each of the liquid crystal light valves 604GB, 604R enters the dichroic prism 606. The prism is formed of two rectangular prisms bonded to each other, and has dielectric multilayer films for reflecting the blue light and the green light disposed on the inside surfaces thereof. The three colored lights are combined by these dielectric multilayer films to thereby form the light representing a color image. Then, the light thus combined is projected on the screen 610 by the projection lens 608 as the projection optical system, and thus an enlarged image is displayed.

According to the projector 600, the first light source module 602GB capable of emitting blue light and green light, and the second light source module 602R capable of emitting red light can be included. Therefore, the number of lens arrays and the number of liquid crystal light valves can be decreased compared to the projector including a light source module for emitting red light, a light source module for emitting green light, and a light source module for emitting blue light respectively. Thus, the cost reduction can be achieved in the projector 600.

According to the projector 600, it is possible to dispose the light source modules 602GB, 602R immediately before the liquid crystal light valves 604GB, 604R, and simultaneously perform the collection and the uniform illumination using the collection lenses 524. Therefore, the loss in the optical system between, for example, the light source modules 602GB, 602R and the liquid crystal light valves 604GB, 604R can be reduced. Therefore, the projector 600 capable of reducing the power consumption, being small in size, and being good for the environment can be realized.

Figure 18:
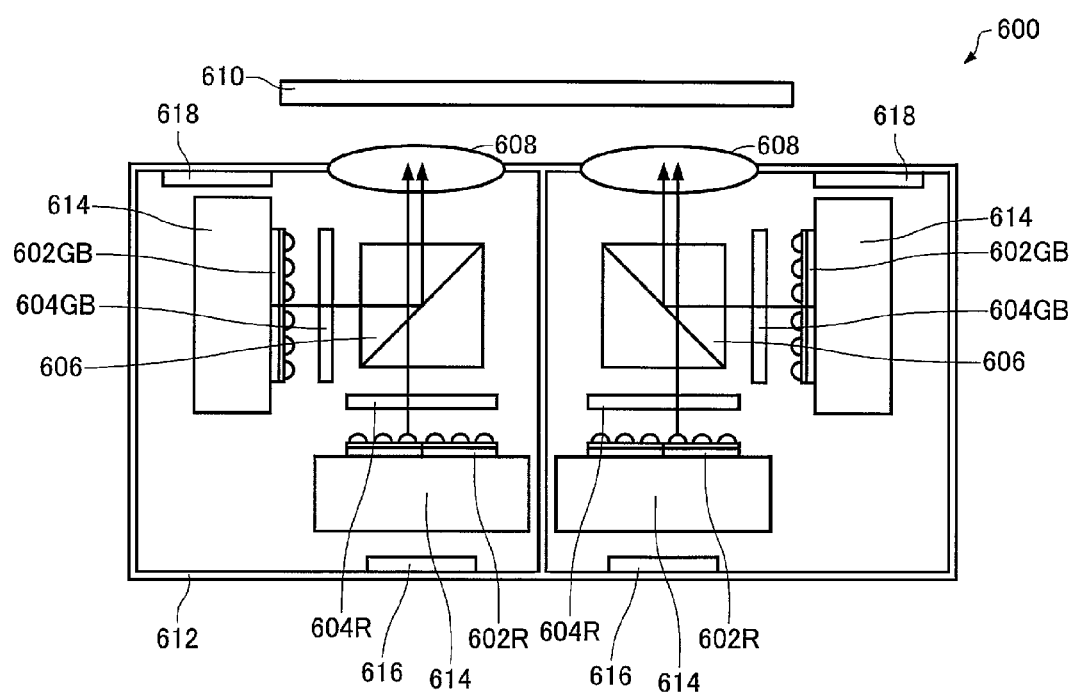
FIG. 18 is a perspective view schematically showing the projector according to the embodiment.

It should be noted that in the example shown in FIG. 17, the projector 600 has a single set of the light source modules 602GB, 602R, the liquid crystal light valves 604GB, 604R, the dichroic prism 606, and the projection lens 608. In contrast, as shown in FIG. 18, the projector 600 can include two sets of the light source modules 602GB, 602R, the liquid crystal light valves 604GB, 604R, the dichroic prism 606, and the projection lens 608. Thus, 3D display becomes possible.

It should be noted that, although the transmissive liquid crystal light valves are used as the light modulation devices in the example described above, it is also possible to use light valves other than the liquid crystal light valves, or to use reflective light valves. As such light valves, there can be cited, for example, reflective liquid crystal light valves and the Digital Micromirror Device™. Further, the configuration of the projection optical system is appropriately modified in accordance with the type of the light valves used therein.

Further, it is also possible to apply the light source modules 602GB, 602R to the light source device of a scanning type image display device (projector) for displaying an image with a desired size on a display surface or a screen by scanning the light from the light source.

The embodiment and the modified examples described above are illustrative only, and the invention is not limited thereto. For example, it is also possible to arbitrarily combine the embodiment and the modified examples described above.

The invention includes configurations substantially the same (e.g., configurations having the same function, the same way, and the same result, or configurations having the same object and the same advantages) as the configuration described as the embodiment of the invention. Further, the invention includes configurations obtained by replacing a non-essential part of the configuration described as the embodiment of the invention. Further, the invention includes configurations exerting the same functional effects and configurations capable of achieving the same object as the configuration described as the embodiment of the invention. Further, the invention includes configurations obtained by adding technologies known to the public to the configuration described as the embodiment of the invention.

The entire disclosure of Japanese Patent Application No. 2012-107959, filed May 9, 2012 is expressly incorporated by reference herein.

What is claimed is:

1. A light emitting device comprising:
   a substrate;
   a laminated body formed by stacking a first cladding layer, a first active layer, a second cladding layer, a third cladding layer, a second active layer, and a fourth cladding layer on the substrate in this order;
   at least one first electrode electrically connected to the first cladding layer;
   a second electrode electrically connected to the second cladding layer and the third cladding layer; and
   a third electrode electrically connected to the fourth cladding layer,
   wherein the first electrode, the second electrode, and the third electrode are located on an opposite surface of the laminated body to the substrate,
   the first active layer generates first light in response to current injected using the first electrode and the second electrode,
   the second active layer generates second light in response to current injected using the second electrode and the third electrode,
   at least one side surface of the first active layer included in a side surface of the laminated body having a normal line perpendicular to a stacking direction of the laminated body is provided with an emitting section from which the first light is emitted, and
   at least one side surface of the second active layer included in the side surface of the laminated body is provided with an emitting section from which the second light is emitted.

2. The light emitting device according to claim 1, wherein
   the first active layer has a first gain region adapted to generate the first light in response to the injection of the current,
   the first gain region includes
      a first gain portion having a belt-like shape extending from a first emitting section provided to a first side surface of the first active layer to a first reflecting section provided to a second side surface of the first active layer,
      a second gain portion having a belt-like shape extending from the first reflecting section to a second reflecting section provided to a third side surface of the first active layer, and
      a third gain portion having a belt-like shape extending from the second reflecting section to a second emitting section provided to the first side surface,
   the second active layer has a second gain region adapted to generate the second light in response to the injection of the current,
   the second gain region includes
      a fourth gain portion having a belt-like shape extending from a third emitting section provided to a fourth side surface of the second active layer to a third reflecting section provided to a fifth side surface of the second active layer,
      a fifth gain portion having a belt-like shape extending from the third reflecting section to a fourth reflecting section provided to a sixth side surface of the second active layer, and
      a sixth gain portion having a belt-like shape extending from the fourth reflecting section to a fourth emitting section provided to the fourth side surface,
   the first side surface and the fourth side surface constitute a part of the side surface of the laminated body having the normal line perpendicular to the stacking direction of the laminated body, and
   the first light emitted from the first emitting section, the first light emitted from the second emitting section, the second light emitted from the third emitting section, and the second light emitted from the fourth emitting section are emitted in a same direction.

3. The light emitting device according to claim 2, wherein
the first gain region and the second gain region each have a
  bracket shape when viewed from the stacking direction
  of the laminated body.
4. The light emitting device according to claim 1, wherein
a wavelength of the first light is no smaller than 435 nm and
  no larger than 485 nm, and
a wavelength of the second light is no smaller than 485 nm
  and no larger than 570 nm.
5. The light emitting device according to claim 2, wherein
the first gain region and the second gain region fail to
  overlap each other when viewed from the stacking direction of the laminated body.
6. The light emitting device according to claim 2, wherein
the second gain portion of the first gain region includes a
  gap section where the second gain portion is divided,
  and
the fourth gain portion of the second gain region is disposed so as to pass through the gap section when viewed
  from the stacking direction of the laminated body.
7. The light emitting device according to claim 2, wherein
the first gain region is surrounded by the second gain region
  and the first side surface when viewed from the stacking
  direction of the laminated body.
8. The light emitting device according to claim 2, wherein
the second electrode has a surface larger than the first gain
  region to cover the first gain region when viewed from
  the stacking direction of the laminated body,
the third electrode has a surface larger than the second gain
  region to cover the second gain region when viewed
  from the stacking direction of the laminated body,
the first gain region is located below an end portion of the
  second electrode, the end portion being located near to
  the second gain region, and
the second gain region is located below an end portion of
  the third electrode, the end portion being located near to
  the first gain region.
9. A projector comprising:
the light emitting device according to claim 1;
a light modulation device adapted to modulate the lights
  emitted from the light emitting device in accordance
  with image information to form an image; and
a projection device adapted to project the image formed by
  the light modulation device.
10. A projector comprising:
the light emitting device according to claim 2;
a light modulation device adapted to modulate the lights
  emitted from the light emitting device in accordance
  with image information to form an image; and
a projection device adapted to project the image formed by
  the light modulation device.
11. A projector comprising:
the light emitting device according to claim 3;
a light modulation device adapted to modulate the lights
  emitted from the light emitting device in accordance
  with image information to form an image; and
a projection device adapted to project the image formed by
  the light modulation device.
12. A projector comprising:
the light emitting device according to claim 4;
a light modulation device adapted to modulate the lights
  emitted from the light emitting device in accordance
  with image information to form an image; and
a projection device adapted to project the image formed by
  the light modulation device.
13. A projector comprising:
the light emitting device according to claim 5;
a light modulation device adapted to modulate the lights
  emitted from the light emitting device in accordance
  with image information to form an image; and
a projection device adapted to project the image formed by
  the light modulation device.
14. A projector comprising:
the light emitting device according to claim 6;
a light modulation device adapted to modulate the lights
  emitted from the light emitting device in accordance
  with image information to form an image; and
a projection device adapted to project the image formed by
  the light modulation device.
15. A projector comprising:
the light emitting device according to claim 7;
a light modulation device adapted to modulate the lights
  emitted from the light emitting device in accordance
  with image information to form an image; and
a projection device adapted to project the image formed by
  the light modulation device.
16. A projector comprising:
the light emitting device according to claim 8;
a light modulation device adapted to modulate the lights
  emitted from the light emitting device in accordance
  with image information to form an image; and
a projection device adapted to project the image formed by
  the light modulation device.
17. A super-luminescent diode comprising:
a substrate;
a laminated body formed by stacking a first cladding layer,
  a first active layer, a second cladding layer, a third cladding layer, a second active layer, and a fourth cladding
  layer on the substrate in this order;
at least one first electrode electrically connected to the first
  cladding layer;
a second electrode electrically connected to the second
  cladding layer and the third cladding layer; and
a third electrode electrically connected to the fourth cladding layer,
wherein the first electrode, the second electrode, and the
  third electrode are located on an opposite surface of the
  laminated body to the substrate,
the first active layer generates first light in response to
  current injected using the first electrode and the second
  electrode, and
the second active layer generates second light in response
  to current injected using the second electrode and the
  third electrode.
18. A projector comprising:
the super-luminescent diode according to claim 17;
a light modulation device adapted to modulate the lights
  emitted from the super-luminescent diode in accordance
  with image information to form an image; and
a projection device adapted to project the image formed by
  the light modulation device.

* * * * *